US012694924B2

(12) United States Patent
Agarwal et al.

(10) Patent No.: US 12,694,924 B2
(45) Date of Patent: Jul. 28, 2026

(54) SYSTEMS AND METHODS FOR EXTENDING DELAY IN SELF-TIMED MEMORY

(71) Applicant: Arm Limited, Cambridge (GB)

(72) Inventors: Navin Agarwal, Bangalore (IN); Yattapu Viswanatha Reddy, Bangalore (IN); Renu Rawat, Bangalore (IN); Georgy Jacob, Bangalore (IN); Avinash Merugu, Bangalore (IN); Yanduri Kaliamma, Krishna (IN); Daksheshkumar Maganbhai Malaviya, Bangalore (IN); Ashish Kumar Srivastava, Bangalore (IN); Yuvaraj Munirathinam, Bangalore (IN); Tangudu Sivaramgupta, Bangalore (IN); Rajiv Kumar Sisodia, Bangalore (IN); Prashantkumar Jayantilal Vaghasia, Austin, TX (US); Vishal Vinay Thakre, Austin, TX (US); Jaspreet Singh, Bangalore (IN); Munish Kumar, Greater Noida West (IN)

(73) Assignee: Arm Limited, Cambridge (GB)

( * ) Notice: Subject to any disclaimer, the term of this patent is extended or adjusted under 35 U.S.C. 154(b) by 177 days.

(21) Appl. No.: 18/592,326

(22) Filed: Feb. 29, 2024

(65) Prior Publication Data

US 2025/0279131 A1 Sep. 4, 2025

(51) Int. Cl.
*G11C 7/22* (2006.01)
*G11C 11/4076* (2006.01)
*G11C 11/4096* (2006.01)
*G11C 29/00* (2006.01)
*G11C 7/10* (2006.01)

(52) U.S. Cl.
CPC ............ *G11C 11/4076* (2013.01); *G11C 7/22* (2013.01); *G11C 11/4096* (2013.01); *G11C 29/842* (2013.01); *G11C 7/1072* (2013.01)

(58) Field of Classification Search
CPC ........... G11C 8/18; G11C 8/08; G11C 11/412; G11C 11/413; G11C 11/419; G11C 7/12; G11C 7/227; G11C 11/4076; G11C 11/4096; H03K 19/01742
See application file for complete search history.

(56) References Cited

U.S. PATENT DOCUMENTS

| | | | |
|---|---|---|---|
| 9,858,988 B1 * | 1/2018 | Ghosh .................... | G11C 7/227 |
| 9,928,889 B1 * | 3/2018 | Narasimhan ......... | G11C 7/1075 |
| 10,283,191 B1 * | 5/2019 | Pathak .................. | G11C 11/419 |
| 2009/0040846 A1 * | 2/2009 | Chang ..................... | G11C 7/22 |
| | | | 365/194 |
| 2009/0231934 A1 * | 9/2009 | Jung ........................ | G11C 7/08 |
| | | | 365/194 |

(Continued)

*Primary Examiner* — Mushfique Siddique

(74) *Attorney, Agent, or Firm* — Pramudji Law Group PLLC; Ari Pramudji

(57) ABSTRACT

According to one implementation, a method includes determining a self-timed path (STP) circuit based on a first resistor-capacitor (RC) delay and a logic delay, wherein the first RC delay includes a delay associated with a first dummy wordline (DWL) and a dummy bitline (DBL); and extending the STP circuit based on a second RC delay, wherein the second RC delay includes a delay associated with an extended DWL.

20 Claims, 11 Drawing Sheets

(56)            References Cited

U.S. PATENT DOCUMENTS

| | | | |
|---|---|---|---|
| 2014/0119101 A1* | 5/2014 | Wang | G11C 16/04 |
| | | | 365/154 |
| 2015/0049563 A1* | 2/2015 | Maiti | G11C 7/22 |
| | | | 365/194 |
| 2018/0151219 A1* | 5/2018 | Hsu | G11C 7/227 |
| 2020/0342916 A1* | 10/2020 | Chhabra | G11C 11/413 |
| 2021/0110853 A1* | 4/2021 | Gupta | G11C 13/004 |
| 2022/0122655 A1* | 4/2022 | Mathur | G11C 7/227 |

* cited by examiner

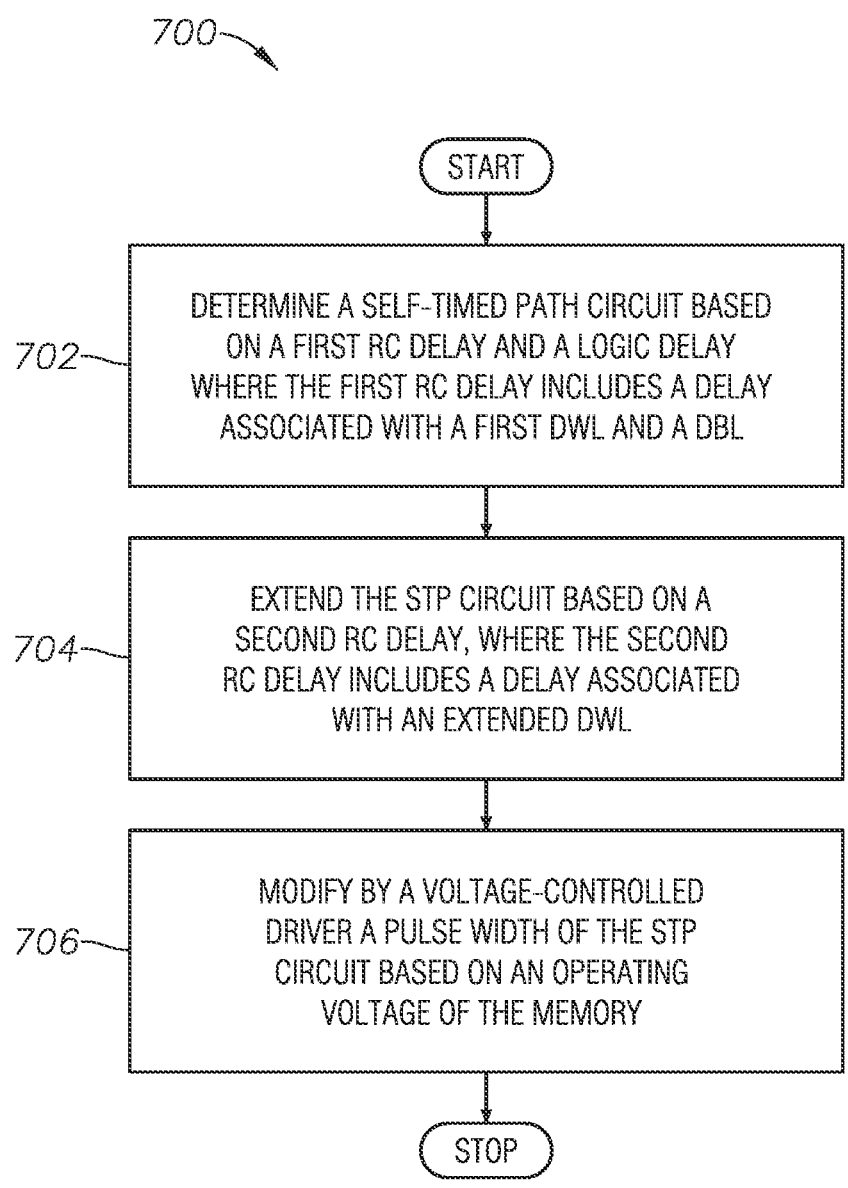

700

START

702 — DETERMINE A SELF-TIMED PATH CIRCUIT BASED ON A FIRST RC DELAY AND A LOGIC DELAY WHERE THE FIRST RC DELAY INCLUDES A DELAY ASSOCIATED WITH A FIRST DWL AND A DBL

704 — EXTEND THE STP CIRCUIT BASED ON A SECOND RC DELAY, WHERE THE SECOND RC DELAY INCLUDES A DELAY ASSOCIATED WITH AN EXTENDED DWL

706 — MODIFY BY A VOLTAGE-CONTROLLED DRIVER A PULSE WIDTH OF THE STP CIRCUIT BASED ON AN OPERATING VOLTAGE OF THE MEMORY

STOP

START

802 — PROVIDE A FIRST DELAY TO A STP CIRCUIT CONFIGURED TO TRACK AT LEAST ONE OF A READ OR A WRITE OPERATION, WHERE THE FIRST DELAY CORRESPONDS TO A DURATION OF CIRCUIT OPERATION ON A FIRST DWL AND DBL

804 — PROVIDE A SECOND DELAY TO THE STP CIRCUIT FOR THE WRITE OPERATION, WHERE THE SECOND DELAY CORRESPONDS TO A DURATION OF THE CIRCUIT OPERATION ON AN EXTENDED DWL

STOP

SYSTEMS AND METHODS FOR EXTENDING DELAY IN SELF-TIMED MEMORY

FIELD

This disclosure pertains to systems and methods to extend delay.

DESCRIPTION OF RELATED ART

This section is intended to provide information relevant to understanding various technologies described herein. As the section's heading implies, this is a discussion of related art that in no way implies that the discussion is prior art. Generally, related art may or may not be considered prior art. Any statement in this section should be read in this light, and not as admission of prior art.

Self-timed memories are a type of memory architecture where the timing of memory operations can be controlled by internal signals rather than a global clock signal. Self-timed memories can operate asynchronously, allowing different memory access operations to progress independently based on their internal timing signals. Unlike synchronous memories that rely on a global clock signal to synchronize all operations, self-timed memories operate independently of a central clock. Each memory access or operation can progress based on local control signals triggered by specific events, such as a completion of a previous operation or arrival of data. Self-timed memories can offer robust flexibility in handling variable delays or changing conditions within the memory system. Further, self-timed memories can adapt to varying access times or processing delays without the rigid constraints imposed by a centralized clock. Additionally, asynchronous operation can allow self-timed memories to be power-efficient compared to synchronous counterparts as they only consume power when actively processing or accessing data, reducing overall power consumption. In certain scenarios, self-timed memories can provide higher performance by allowing multiple memory operations to occur concurrently or by adapting dynamically to varying access times.

BRIEF DESCRIPTION OF THE DRAWINGS

Implementations of various techniques are described herein with reference to the accompanying drawings. The accompanying drawings illustrate various implementations described herein and are not meant to limit implementations of various techniques described herein.

FIG. 7 is an example procedure, in accordance with certain implementations.

Figure 1:
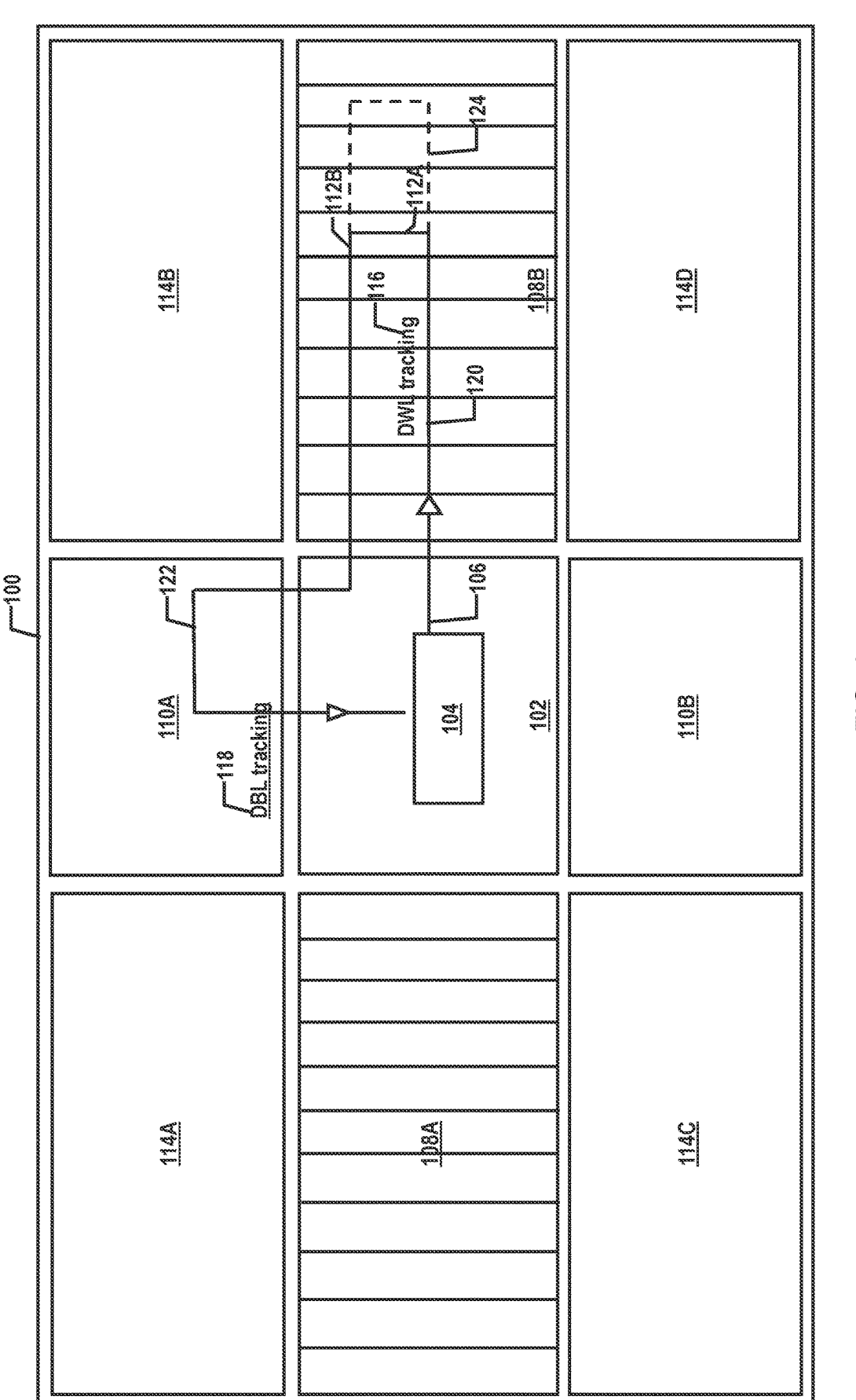
FIG. 1 is a diagram, in accordance with certain implementations.

Reference is made in the following detailed description to accompanying drawings, that form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other implementations may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, and the like), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

According to one implementation of the present disclosure, a method (e.g., of precise and accurate (i.e., optimized) write operation due to improved resistor-capacitor (RC) delay "tracking") includes determining a self-timed path (STP) circuit of a memory, where the STP circuit includes at least one or more first delay elements of a plurality of delay elements on a first dummy wordline (DWL) and a dummy bitline (DBL) corresponding to write logic circuitry of the STP circuit; determining a logic delay of the STP circuit based at least on a delay associated with the write logic circuitry, where the logic delay corresponds to a pulse width; providing a first resistor-capacitor (RC) delay based on the logic delay, where the first RC delay includes a duration associated with one or more signals propagating through the first DWL and the DBL, and the first RC delay corresponds to a first augmentation of the pulse width; providing the STP circuit with an extended DWL; providing a second RC delay, where the second RC delay includes a duration associated with one of the signals propagating on the extended DWL, and the second RC delay corresponds to a second augmentation of the pulse width; and performing a write operation on the memory based on the pulse width and the first and second augmentations of the pulse width.

According to another implementation of the present disclosure, a method (i.e., of optimized combined read and write RC delay tuning on a self-timed path circuit in self-timed memory) includes determining a self-timed path (STP) circuit based on a first resistor-capacitor (RC) delay and a logic delay, wherein the first RC delay includes a delay associated with a first dummy wordline (DWL) and a dummy bitline (DBL); and extending the STP circuit based on a second RC delay, wherein the second RC delay comprises a delay associated with an extended DWL.

According to another implementation of the present disclosure, a method includes providing a first delay to a self-timed path (STP) circuit configured to track at least one of a read or a write operation, wherein the first delay corresponds to a duration of a circuit operation on a first dummy wordline (DWL) and dummy bitline (DBL); and providing a second delay to the STP circuit for the write operation, wherein the second delay corresponds to a duration of the circuit operation on an extended DWL.

According to another implementation of the present disclosure, a method (i.e., for tuning a STP circuit for read and write operations) includes tuning, by a self-timed path circuit, a read operation; and tuning, by the self-time path circuit, a write operation, where the read operation is configured to be tuned based at least on a first resistor-capacitor (RC) delay and a logic delay; and the write operation is configured to be tuned based at least on the first RC delay, the logic delay, a fixed delay, and a second RC delay.

Certain schemes and techniques outlined herein involve independently "tracking" (i.e., monitoring) and managing RC (signal propagation) delays related to both read and write operations. Further, in certain aspects, the innovative techniques can involve implementing such tracking schemes driven by the write operations and based on RC characteristics. In certain implementations, a RC tracking scheme can include monitoring, adjusting, and optimizing the resistance and capacitance components related to writing data in the memory, allowing for better control and efficiency without compromising other key parameters. Advantageously, such "RC tracking" can optimize Power, Performance, and Area (PPA) metrics without impacting the access time of self-timed memory. Other schemes and techniques outlined herein allow for "cleaning" and/or "improving" (e.g., enhancing the reliability and robustness of the memory write process that can involve ensuring a substantial safety margin between the minimum required strength of the write signal (needed to reliably store data) and the actual strength of the signal used for writing) the write margin (i.e., the safety margin between the minimum required write signal strength and the actual strength). Beneficially, such cleaning and/or improving the write margin does not adversely affect other design aspects like area (i.e., physical chip space), leakage (i.e., unintended power loss), power consumption, or access time (i.e., time taken to access memory).

Certain schemes and techniques outlined herein pertain to enhancing write "tracking" to achieve better performance across different voltage domains. Advantageously, such schemes and techniques can address the challenges identified by analyzing self-timed memory in the N3E process (i.e., in semiconductor manufacturing, the 3 nm process is the next die shrink after the 5 nanometer MOSFET (metal-oxide-semiconductor field-effect transistor) technology node an enhanced 3 nm chip process called N3E may have started production in 2023). For instance, the proposed techniques can improve performance gain by approximately 10%. Further, the techniques can mitigate write tracking challenges and enhance overall memory performance. Certain inventive aspects outlined herein involve dedicated self-time path (STP) tuning specifically for write operations without impacting read access time. Further, the dedicated STP tuning can include implementing a separate dummy word line (DWL) or an RC tracking mechanism active only during write cycles.

Various schemes and techniques outlined herein pertain to enhancing PPA by controlling RC delays across various voltage domains to meet predetermined frequency targets. In certain implementations, such innovative aspects utilize enhanced RC tracking tuned specifically for higher voltages to capture 'full' RC delay impact (i.e., a longer duration word-line pulse width) and reduce this 'full" RC delay impact at lower voltages. Advantageously, the techniques can employ a comprehensive RC load driven from the near end (i.e., the closer proximity to a signal's origin or source) and sensed from the farthest end (i.e., the more distant or destination of the signal path) that effectively tackles the challenges encountered within a high-voltage domain. For instance, by incorporating the extensive RC load and precise sensing mechanisms, such inventive aspects ensure that the write operation occurs within a predetermined, specified word-line pulse-width, optimizing the efficiency of data writing despite any observed difficulties. Further, in lower voltage domains, a significantly reduced RC tracking method can be used ensure that the write operation occurs within the word-line pulse-width. The technique can implement a "Programmable/Weak driver" at the far-end, that can strategically reduce the RC impact while achieving the desired delay.

Certain definitions have been provided herein for reference. A High-Density (HD) bit-cell can refer to a configuration or layout of memory cells within a memory array that can allow for a higher packing density of memory elements in each area. In semiconductor memory design, such as, for example, in Dynamic Random Access Memory (DRAM) and Static Random Access Memory (SRAM), the bit-cell is the fundamental unit that stores a single bit of information (i.e., either a 0 or a 1). An HD bit-cell configuration can optimize the layout and arrangement of these memory cells to maximize the number of cells within a limited space, usually a silicon chip. Further, HD bit-cells can be designed to occupy less physical area on the chip compared to standard or lower-density bit-cells, allowing more memory cells to be packed into the same chip area. Moreover, HD bit cells can achieve higher memory capacity without significantly increasing the chip size or sacrificing performance. Furthermore, achieving higher density can often involve more intricate circuitry and design techniques to manage and access the densely packed memory cells efficiently.

In certain cases, "tuning writes" refers to the process of optimizing or adjusting various parameters or characteristics associated with writing data into a memory system, such as a memory chip or a storage device. Advantageously, the optimization can enhance the efficiency, speed, reliability, or other performance aspects of the write operation. In the context of semiconductor memory design or computer systems, tuning writes can involve fine-tuning specific parameters or configurations that can affect how data is written into memory cells or storage elements. Some aspects that might be tuned during write operations include: (1) adjusting the timing of the write operation, such as setup time, hold time, or transition times, to ensure data is properly written and stored; (2) optimizing signal strengths or voltage levels to ensure reliable and error-free writing of data, especially in high-speed or high-frequency systems; (3) mitigating electromagnetic interference (EMI), noise, or crosstalk that might affect the integrity of the data being written; (4) implementing error correction codes (ECC) or error-detection mechanisms to identify and rectify data errors during writing processes; (5) adjusting internal circuitry or timing constraints within the memory system to improve the efficiency and speed of write operations; and (6) managing voltage levels and power consumption during write operations to optimize energy efficiency without compromising performance.

In semiconductor memory design, especially in technologies like DRAM and SRAM, the "word line" (WL) is a component in the architecture of the memory array. Further, the WL is a control line used to select or address a specific row of memory cells within the memory array. When the WL is activated (i.e., brought to a specific voltage level), the WL can enable access to all the memory cells in that row simultaneously. Additionally, the memory cells are arranged in rows and columns, forming a matrix structure. Further, the intersection of a row and column represents a memory cell. Each row in this matrix is connected to a dedicated WL. By activating specific WLs, the memory controller or processor can access data stored in specific rows of the memory array. In conjunction with other control lines, such as bit lines, the WL aids in the precise addressing of individual memory cells.

In semiconductor memory design, a "dummy word-line" (DWL) is a replica word-line added to a memory array alongside the functional word-lines (WLs). Unlike functional WLs used to select rows of memory cells for read or write operations, a DWL does not address any actual memory cells. Instead, advantageously, as described herein, such a DWL can be inserted intentionally for optimization purposes. Further, DWLs can redistribute or equalize charges in the memory cells or associated circuitry, reducing or compensating for disturbances like noise or interference. Additionally, DWLs can help balance signal levels, mitigate voltage drops, or manage capacitance effects across the memory array. By stabilizing signals or voltages, DWLs can contribute to improved stability and reliability of memory operations, especially in HD memory designs where signal integrity is useful.

Word generation (WDX) cells are components within a memory architecture responsible for generating or managing word lines in memory arrays. Further, the WDX cells can play a role in facilitating memory operations by managing the activation and deactivation of specific word lines, which in turn allow access to the memory cells within a particular row for read or write operations. WDX cells are typically designed to control the timing and activation of word lines, ensuring that the appropriate row of memory cells is accessed accurately and efficiently. Moreover, WDX cells can play a role in addressing specific rows in memory arrays, enabling the transfer of data to and from the memory cells during read and write operations.

Read access time can refer to the duration or the time taken for a memory system to retrieve or access data stored in a specific memory location after a read command is issued. Read access time is measured in units of time, often in nanoseconds (ns) or picoseconds (ps), indicating the time taken for the memory to respond to a read request. Further, read access time is a metric in memory systems as it directly impacts the speed at which data can be read from memory. Additionally, different types of memory (such as DRAM, SRAM, NAND Flash, and the like) have varying read access times. Moreover, factors like the memory architecture, circuitry design, technology node, and access method can influence the read access time. Furthermore, the read access time can significantly affect the overall performance of systems that rely on memory, such as computers, by determining how quickly the processor can access required data.

In semiconductor memory design, a BL refers to a component within the memory array that facilitates the reading and writing of data to memory cells. Further, the BL is a wire or conductor that connects a row (or multiple rows) of memory cells within the memory array. Additionally, the BL plays a role in both reading data from and writing data to the memory cells. Moreover, BLs can often be paired with sense amplifiers. For example, during read operations, the sense amplifiers can detect and amplify "small" signals generated by the memory cells along the BL. The BL can carry binary data (e.g., 0s and 1s) to and from the memory cells, enabling the transfer of information between the memory cells and other parts of the memory system. During a read operation, the BL can help retrieve the stored data from the selected memory cells by sensing and amplifying the signals generated by those cells. In a write operation, the BL facilitates the transfer of data to the selected memory cells, enabling the storage of new information in the memory array.

A dummy bit line (DBL) is a replica bit line that is included in memory architectures, especially in dynamic random-access memory (DRAM) designs. A DBL can minimize interference and improve the accuracy of sensing operations on the actual bit lines (BLs) used for data access. Often running parallel to the regular BLs, the DBL can be designed to mirror the behavior of the true BLs without carrying any actual data. During read or write operations, the DBL behaves similarly to the active bit lines, experiencing similar environmental conditions and noise. By sensing and amplifying signals on both the actual BLs and the dummy BLs, any variance or interference caused by environmental factors—such as noise, voltage fluctuations, or disturbances—is more accurately identified and compensated for during data access. The DBL essentially acts as a reference or control line, aiding in noise cancellation and ensuring more reliable and accurate read and write operations on the primary bit lines within the memory array.

In the context of semiconductor design, particularly concerning memory architecture and operation, the terms "near end" and "far end" often refer to specific locations or positions within a circuit, rather than literal physical distances. Near end can refer to the closer proximity or position within the circuitry, typically closer to the initial point of a signal transmission or operation. Further, near end can indicate the starting point or initial stage of a signal path or operation. Far end can represent the distant or remote point within the circuitry, often farther along the signal path from the starting point. Further, far end might denote the endpoint or final stage of a signal path or operation. In the context of memory design, these terms could relate to specific stages or elements within the memory circuitry, such as addressing points, sensing circuits, or control mechanisms. For instance, concerning the discussion of RC tracking or delay sensing, the "near end" can refer to the initial point where signals are driven or initiated, while the "far end" could indicate the distant point where these signals are sensed or measured for delay tracking purposes.

Write tracking, an aspect of self-timed memory design, can pose challenges in achieving optimal performance. One notable issue is the degradation of HD bit-cell writability in, for example, 3 nm semiconductor manufacturing processes. Further, the challenges extend to impacting the frequency target associated with cores due to differences in target instances (i.e., a particular occurrence or case of a component or module within the system) and voltage domains. Moreover, the disparity creates difficulties in maintaining the desired frequency. Furthermore, traditional methods for tuning writes face inefficacy due to the sigma target, causing the traditional methods for tuning writes not to function effectively in achieving desired performance levels. Additionally, issues related to writing data at high voltages adversely affect PPA parameters at low voltages and vice versa, leading to challenges in achieving balance and efficiency across voltage ranges.

Writability of HD bit cells can pose complexities in self-timed memory design, especially in memory structures impacted by the high RC of the word-line. Further, current technologies show a degradation in writing HD bit cells, particularly concerning the WL levels. Additionally, this degradation is not solely limited to low voltages but can extend to higher voltages as well, affecting write operations across voltage ranges. At high or nominal voltages, the impact of resistance and capacitance can vary significantly, posing difficulties in tuning for optimal performance at all voltage levels.

In a particular approach, a worst-case delay between a given RC delay and logic delay would be utilized. However, such an approach can lead to higher delays in both high and low voltage domains. Further, current designs face challenges where tuning for one domain (e.g., a higher voltage domain needing higher RC delay tracking) adversely impacts other domains. Moreover, logic delays might not suffice for some domains, affecting performance targets and PPA. For cores, meeting stringent frequency conditions across all voltage domains can prove challenging without impacting performance. Additionally, existing design approaches struggle to achieve targets uniformly across different voltage domains.

In higher voltage domains, certain conditions contribute to challenges during the write operation. The word-line's ascent tends to slow down after reaching 90% of the VDDC level. Further, the condition can result in the BL maintaining higher voltage levels. Due to the elevated BL voltage levels, the duration for writing data significantly increases. Advantageously, to address these challenges and ensure efficient writing within the expected timing constraints, certain inventive aspects allow for the capacity for a substantial RC delay tracking mechanism. Further, the inventive tracking schemes and techniques can ensure that the write operation aligns with the prescribed word-line pulse-width, despite, for example, certain difficulties posed by the slow rise of the word-line and the impact on BL levels caused by the STP memory's "strong" PMOS behavior.

In lower voltage domains, such a "full" RC delay can lead to excessive penalties (e.g., undesired consequences or drawbacks resulting from excessive RC delay, for example, causing issues such as prolonged cycle times or reduced efficiency in the functioning of the circuit). to a predetermined cycle time. Such penalties can include: a prolonged duration (e.g., indicating that operations or processes take longer than intended due to the excessive delay), or a surpassing of a predetermined limit (e.g., a threshold or boundary that should not be surpassed or exceeded, for example, related to an acceptable or expected delay in the circuit) and, thus, resulting in an overload of stages beyond the predetermined limit. Advantageously, to alleviate such penalties, certain inventive aspects allow for the capacity to reduce the comprehensive RC delay in STP memory and circuitry.

FIG. 1 is a diagram of an example asynchronous self-timed path (STP) circuit 100 within a memory architecture, in accordance with some implementations. As illustrated in FIG. 1, the example asynchronous STP circuit 100 within the memory architecture is configured to track propagation delay. Advantageously, the resultant tracked propagation delay may be subsequently used for read and write operations. The example asynchronous STP circuit 100 can include bitcell arrays 114A, 114B, 114C, and 114D, column cells 108A and 108B, WDX cells 110A and 110B, and control block 102. Further, the bitcell arrays 114A, 114B, 114C, and 114D can be organized in rows and columns where each intersection point representing a single memory cell where each memory cell stores a single bit of data.

Additionally, the column cells 108A and 108B can be associated with specific columns of the bitcell arrays 114A, 114B, 114C, and 114D.

In FIG. 1, positioned at the center of the example asynchronous STP circuit 100 is the control block 102 that can serve as a primary processing unit for the example asynchronous STP circuit 100. Further, the control block 102 can house a clock generator 104 that can generate clock signals and clock signal derivatives for signal tracking. In certain cases, the clock generator 104 can output a clock signal along a clock signal path, such as self-timed path 106 that can represent a tracking mechanism. In addition, the control block 102 can manipulate the clock signal and alter the clock signal path playing a role in row-wise tracking. As a clock signal navigates along the self-timed path 106 through column cells 108B and back towards the control block 102 and into the WDX cells 110A, instance-dependent adjustments can determine signal turns, such as signal turns 112A and 112B, that can enable row-wise tracking optimizations. Further, signals generated along the self-timed path 106 can act as indicators for initiating operation resets. For instance, such signal-based triggers can prompt the system to reset ongoing operational cycles.

In various implementations, the signals along the self-timed path 106 can include a DWL tracking signal 116 and a DBL tracking signal 118. As may be appreciated, these signals can monitor or track the behavior, signals, or delays related to a DWL 120 and a DBL 122. The DWL tracking signal 116 can propagate along the DWL 120 as well as the DBL tracking signal 118 can propagate along the DBL 122. Moreover, the tracking can involve monitoring the resistance and capacitance along the dummy lines to ensure that the dummy lines "mimic" the behavior of the actual word and bit lines. Additionally, the mimicked behavior of the actual word and bit lines can ensure that the timing, delays, and performance characteristics of the dummy lines match the operational behavior of the functional lines within the memory array. Further, the control block 102 can coordinate and guide the DWL tracking signal 116 and the DBL tracking signal 118, which are responsible for quantifying delays associated with DWL 120 and DBL 122 to ensure the duration of signals or pulses meet timing conditions for read and write operations. In addition, the signals along these lines should align with the conditions of the memory circuitry to guarantee accurate data retrieval and storage. Moreover, the DWL tracking signal 116 and the DBL tracking signal 118 can detect signals or triggers that signify the need for operational resets within the DWL 120 and the DBL 122. Such signals can prompt the system to reset ongoing operational cycles for efficiency and accuracy. Furthermore, advantageously, the tracking of the DWL 120 and the DBL 122 can involve meticulous monitoring and adjustments to ensure that dummy lines effectively mimic the behavior of the operational word-lines and bit-lines within the memory array, contributing to the overall reliability and performance of the memory system.

The DWL tracking signal 116 and the DBL tracking signal 118 can be derived from the clock signal and can be utilized for comprehensive tracking (e.g., including resistance and capacitance delay, logic delay and various fixed delay) across the memory architecture. Further, in certain instances, the tracking can involve monitoring and adjusting resistance and capacitance based on signal paths, such as the self-timed path 106 and turn indications, such as the turns 112A and 112B. Moreover, the DWL tracking signal 116 can follow the self-timed path 106, based on instance size considerations, moving rightward and then determining the turns for row-wise tracking. Furthermore, the generated signals can indicate the condition for operation reset based on tracking information. Accordingly, such signals can relay information indicating the completion of read and write operations, prompting the closure of these operations and signaling reset. Thus, the example asynchronous STP circuit 100 can operate on a self-timed path basis, utilizing the signals and derived information to manage read and write operations and initiate resets accordingly.

FIG. 1 illustrates the example asynchronous STP circuit 100 integrated into a memory architecture, supporting read and write operations. Positioned centrally is the control block 102 housing the clock generator 104, manipulating clock signals along the self-timed path 106, enabling row-wise tracking and operational resets within the example asynchronous STP circuit 100. Further, the self-timed path 106 can generate signals like DWL tracking signal 116 and DBL tracking signal 118 for mimicking operational line behaviors and ensuring timing precision.

According to inventive aspects, the combined read and write RC delay of the STP circuit 100 can be optimized. In certain examples, the optimization can involve extending (e.g., adjusting) the example asynchronous STP circuit 100 based on a corresponding RC delay associated with the DWL tracking signal 116 and the DBL tracking signal 118. Advantageously, such extensions can fine-tune the example asynchronous STP circuit 100 by incorporating an extended DWL 124 (e.g., an additional DWL portion) to predetermined logic delay elements such as programmable delay chains, buffers, and logic elements. Moreover, as described in below paragraphs, advantageously, additional adjusting of the pulse width of the example asynchronous STP circuit 100 circuit can be made through a voltage-controlled driver (e.g., controlled driver 460 of FIG. 4B) based on memory operating voltage levels. Further, such a driver can modify the pulse width of an overall delay, thereby enhancing overall performance.

Figure 2:
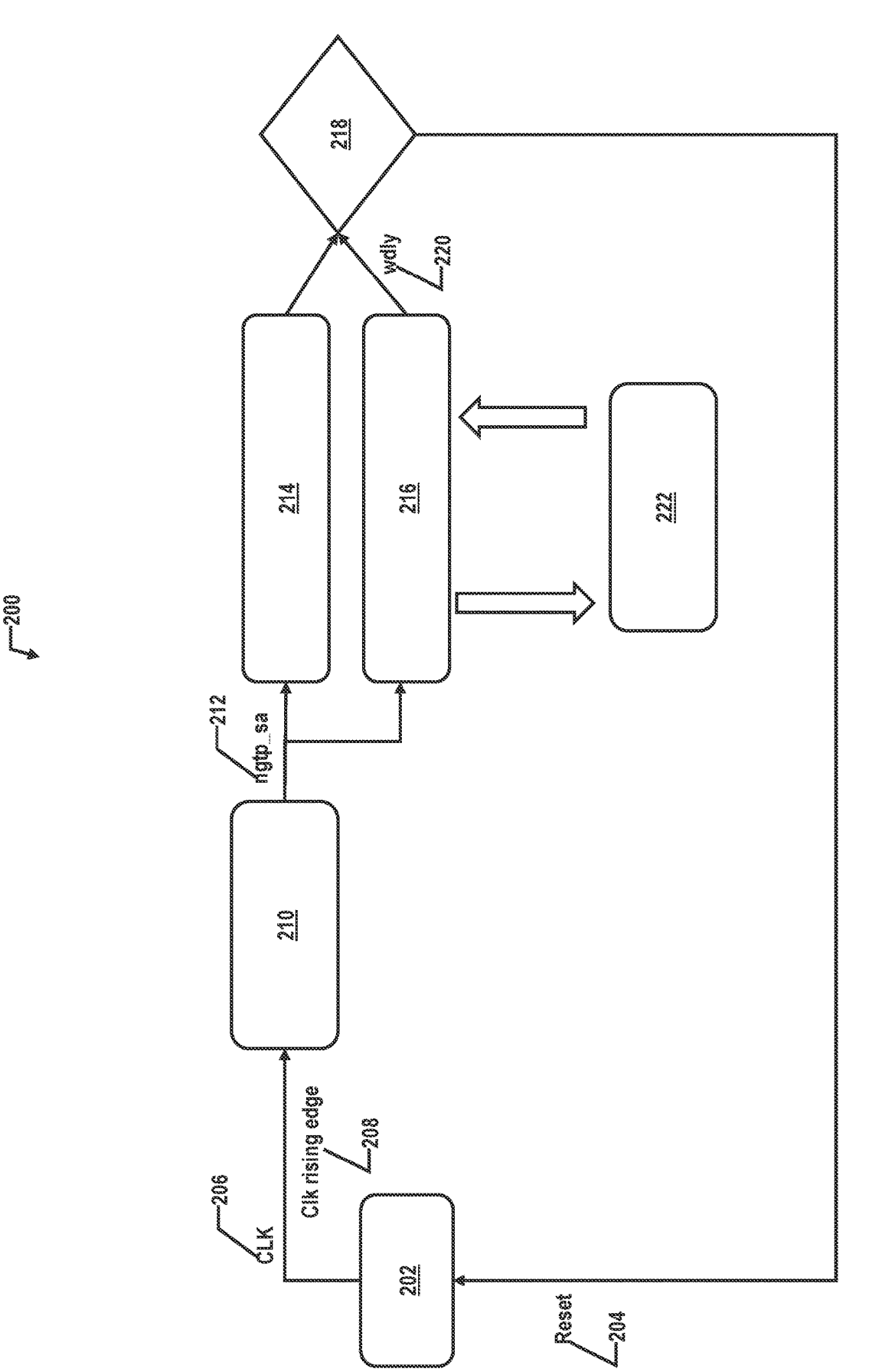
FIG. 2 is a diagram, in accordance with certain implementations.

FIG. 2 is a block diagram of an example asynchronous self-timed path (STP) circuit 200, in accordance with some implementations. As illustrated in FIG. 2, the example asynchronous STP circuit 200 can include a clock generator 202, a first RC tracking block 210, a read mode combinational logic block 214, a write mode combinational logic and programmable fixed delay block 216, a second RC tracking block 222, and a decision block 218.

In an example operation, the clock generator 202 can initialize operation based on a reset signal 204. The reset signal 204 can signify various conditions, such as powering-up, system initialization, or a specific triggering event. Upon receiving the reset signal 204, the clock generator 202 can reset an internal state that can ensure a clean and synchronized start for generating a clock signal 206, typically a square wave with alternating high (1) and low (0) states. In the example asynchronous STP circuit 200, the operation can begin with a clock rising edge 208 but does not rely on a clock falling edge to conclude the operation. Instead, the operation of the example asynchronous STP circuit 200 internally resets using a self-timed logic mechanism that can ensure that the operation does not wait for the clock generator 202 to fall (i.e., a clock falling edge) to reset operations. Advantageously, the self-contained resetting process sets self-timed memories apart from memories that depend on both the rising and falling edges a clock generator for operations.

Continuing with the example operation, the RC tracking block 210 illustrated in FIG. 2 can oversee timing aspects by tracking signal progression and ensuring synchronization.

As illustrated in FIG. 2, the RC tracking block 210 can receive the clock signal 206, originating from the clock generator 202, that can act as the trigger for the operations within the example asynchronous STP circuit 200. The RC tracking block 210 can process the incoming clock signal 206 and generate ngtp_sa signal 212 that can carry timing or control information used by, for example, the read mode combinational logic block 214 and the write mode combinational logic and programmable fixed delay block 216. Moreover, the RC tracking block 210 can maintain synchronization and control signal propagation through the self-timed path that can ensure the timing and progression align with the example asynchronous STP circuit's conditions. Further, in certain aspects, the RC tracking block 210 can predominantly contribute to a read operation, providing a fraction of the total RC tracking. Moreover, in certain cases, the RC tracking block 210 can contribute to a portion of the overall RC tracking required for both read and write operations; approximately 60%.

Continuing with such an example operation, the read mode combinational logic block 214 can be responsible for processing and controlling read operations. As illustrated in FIG. 2, the read mode combinational logic is configured to replicate an initial delay associated with corresponding an example read logic circuitry. Within the read mode combinational logic block 214, the incoming ngtp_sa signal 212 can be processed to facilitate and manage read operations. For instance, facilitating and managing of read operations can involve interpreting timing information or controlling instructions received from the RC tracking block 210 to synchronize and execute the read process accurately. Further, the read mode combinational logic block 214 can generate an output that can contain processed data or instructions related to the read operation that can be transmitted to the decision block 218 for further processing or decision-making.

Continuing with such an example operation, the write mode combinational logic and programmable fixed delay block 216 can receive the ngtp_sa signal 212 that can contain timing or control information related to write operations. As illustrated in FIG. 2, the write mode combinational logic and programmable fixed delay block 216 is configured to replicate an initial delay associated with corresponding write logic circuitry. Advantageously, according to inventive aspects, the write mode combinational logic and programmable fixed delay block 216 can interact with the RC tracking block 222 that is configured provide enhanced or additional RC tracking dedicated specifically for write operations. For instance, data or information from the write mode combinational logic and programmable fixed delay block 216 can be transmitted to the RC tracking block 222 for further processing or tracking without compromising the read cycle. Based upon interaction with the RC tracking block 222, the write mode combinational logic and programmable fixed delay block 216 can generate a WDLY (i.e., a write delay) signal 220 that can contain processed data, controls, or timing information related to write operations. Further, the WDLY signal 220 from the write mode combinational logic and programmable fixed delay block 216 can be transmitted to the decision block 218.

Delving deeper into RC tracking in the write mode combinational logic and the programmable fixed delay block 216, as well as the RC tracking block 222, with a specific focus on enhancing RC tracking during write operations, the approach can involve partitioning RC tracking into distinct components. For instance, in a scenario where the initial RC delay accounts for 60% of the overall tracking in a write cycle, an additional 30% of tracking originates from a separate delay mechanism within the RC tracking block 222, while the remaining 10% stems from a logic delay within the write mode combinational logic and programmable fixed delay block 216. In specific implementations, the example asynchronous STP circuit 200 can maintain the existing circuitry for read operations while integrating a dedicated STP path specifically for write operations. Further, the supplementary write tracking, notably by the RC tracking block 222, can offer performance enhancements and margin improvements without disrupting read operations. In other words, this enhanced write tracking can prevent potential write operation failures while ensuring no detrimental impact on read operations. Another advantage lies in the distribution of tracking responsibilities between the initial RC block 210 and the improved tracking for write operations, ensuring optimized tracking for each without compromising the other. Moreover, the example asynchronous STP circuit 200 can enhance operational efficiency by introducing dedicated and refined RC tracking solely for write operations, preserving the integrity of read operations. Additionally, this approach can minimize area overheads by utilizing the same tracking mechanism for both operations and integrating supplementary replica word and bit lines. Continuing with such an example operation, the decision block 218 can determine the reset signal 204 for the clock generator 202 based on inputs from both the read mode combinational logic block 214 and the write mode combinational logic and programmable fixed delay block 216. Next, the decision block 218 can assess the information received from the read mode combinational logic block 214 and the WDLY signal 220 from the write mode combinational logic and programmable fixed delay block 216. The decision block 218 can also have a set of logical operations or conditions the decision block 218 for evaluation. For instance, the decision block 218 can compare certain thresholds, analyze the state of the read and write operations, or assess specific conditions that dictate when the clock generator 202 should reset. In various implementations, the clock generator 202 can utilize the reset signal 204 to trigger a new self-timed cycle. Additionally, the decision block 218 can ensure that the operations within the example asynchronous STP circuit 200 are synchronized and initiated accounting for timing precision.

In certain inventive aspects, the example asynchronous STP circuit 200 can dynamically manage operations, for example, enhancing write tracking without undermining read performance. Additionally, the strategy can optimize circuitry load distribution and overall performance, distinguishing itself from conventional techniques by adapting to varying conditions without compromising efficiency or reliability.

In various inventive aspects, the example asynchronous STP circuit 200 can introduce RC delays for tracking read and write operations. For example, a first delay of the RC tracking block 210 corresponds to one or more signal propagation delays of a circuit operation over a DWL and DBL, while a second RC delay, specifically designed for write operations, can encompass the one or more signal propagation delays over an extended DWL. Further, such an approach can tailor delays to specific circuit pathways, enabling optimized tracking and efficient operation management for both read and write operations.

Figure 3:
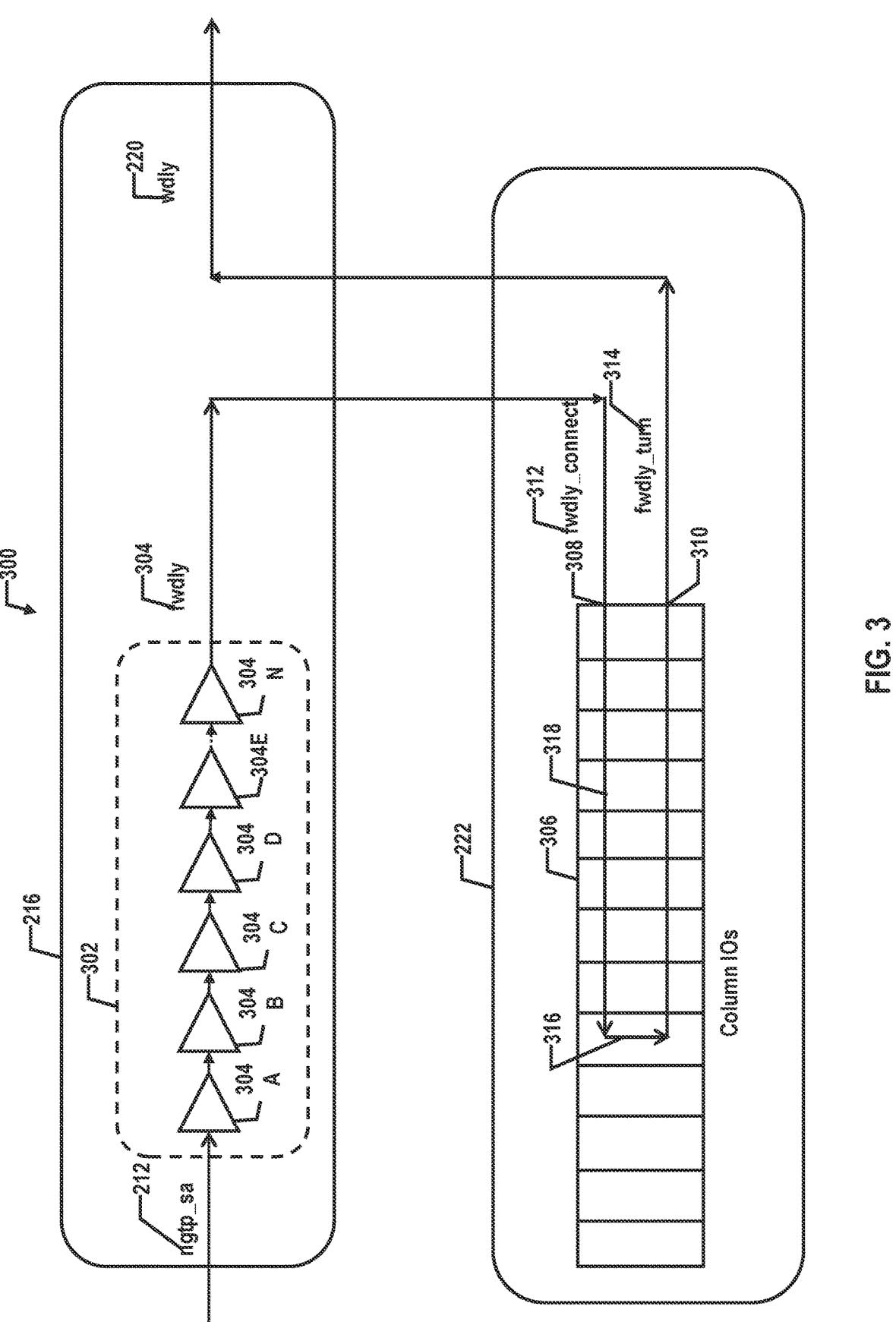
FIG. 3 is a diagram, in accordance with certain implementations.

FIG. 3 is a diagram of an example enhanced RC delay control circuit 300, in accordance with some implementations. As illustrated in FIG. 3, in certain implementations, the example enhanced RC delay control circuit 300 can include programmable delay chains 302 and column cells 306 (e.g., accessible on a signal "pathway" of the extended DWL 318; providing and defining a length of the extended DWL 318) that can include a column input 308 and a column output 310. Advantageously, the "enhancement" of the RC delay (e.g., as shown and described herein with reference to the enhanced RC delay control circuit 300) corresponds to a second RC delay, where the second RC delay comprises a delay duration of one or more signals propagating on the extended DWL 318 (as described herein). In an example operation, the programmable delay chains 302 can facilitate the adjustment and fine-tuning of timing signals in the RC delay control circuit 300. In certain implementations, the programmable delay chains 302 can correspond to logic delay associated with write and/or read logic circuitry. Further, such logic delay would correspond to an initial pulse width (of one or more propagation signals of the STP circuit 100). Further, the programmable delay chains 302 can include interconnected delay elements 304A, 304B, 304C, 304D, 304E, . . . , 304N, that can be buffers designed to impart specific time delays to the ngtp_sa signal 212 (i.e., the first RC delay). Further, the programmable delay chains 302 can contain multiple stages, such as each of the delay elements 304A, 304B, 304C, 304D, 304E, . . . , 304N. Moreover, the stages can include configurable buffers that can introduce controlled delays to the ngtp_sa signal 212 passing through the delay elements 304A, 304B, 304C, 304D, 304E, . . . , 304N. Upon entering the programmable delay chains 302, the ngtp_sa signal 212 can undergo sequential processing through the stages. Each stage can impose a certain delay, either through buffer capacitance or through other techniques aimed at manipulating the signal propagation time. Further, the cumulative effect of the stages within the programmable delay chains 302 can be the generation of a fwdly (i.e., final word delay) signal 304. Moreover, the fwdly signal 304 can represent timing characteristics because of the cumulative delays imparted by the various stages.

In certain implementations, the flexibility and configurability of the programmable delay chains 302 can lie in the programmable nature. Such programmable delay chains 302 can allow for fine-tuned delays by configuring parameters within each stage, such as bias currents or input voltages, thereby enabling precise temporal control over the signal propagation. Moreover, the programmable delay chains 302 can serve as a mechanism to tailor the timing behavior of the fwdly signal 304 that can ensure that the desired delays are introduced without compromising the overall functionality and performance of the example enhanced RC delay control circuit 300.

Continuing an example operation, the column input 308 and the column output 310 can represent the input/output points where data gets transmitted to or from the column cells 306. Further, the column input 308 and the column output 310 can function as "pathways" for the fwdly signal 304 to enter as a fwdly_connect signal 312 (i.e., the fwdly signal 304 upon connection or engagement with a particular column within the column cells 306) or exit the column cells 306 as a fwdly_turn signal 314 (i.e., indicating redirection or deviation of the fwdly_connect signal 312 from an initial path or direction). As one example, similar to the DWL tracking signal 116 of FIG. 1 propagating on the DWL 120, the fwdly signal 304 and the fwdly_connect signal 312 can propagate along an extended DWL 318. Moreover, the column input 308 and the column output 310 can manage the flow of signals that can ensure proper communication between the column cells 306 and external systems. Further, the column cells 306 can collectively form the storage units within a memory array.

Continuing an example operation, the fwdly_connect signal 312, enters the column cells 306 and extends along the column cells 306. Additionally, the fwdly_connect signal 312 can take a programmable turn 316 at a specific column that can refer to a configurable alteration in the signal's path within the column cells 306. Further, the 'turn' can represent a controlled branching or redirection of the signal's trajectory that can be determined by the circuit 300. In some instances, such a "turn" may be determined by the programmable delay chains 302 of the circuit 300. Furthermore, the fwdly_connect signal 312 can then exit the column cells 306 as the fwdly_turn signal 314 that can signify the completion of a designated path within the column cells 306. As one example, similar to the DBL tracking signal 118 and the DWL tracking signal 120 of FIG. 1 propagating on the DBL 122 and DWL 120, the fwdly_turn signal 314 can propagate along the extended DWL 318.

In some implementations, the extended DWL 318 corresponds at least to the cumulative effect or amalgamation of the ngtp_sa signal 212, the fwdly 304 signal, and the fwdly_connect signal 312. In various implementations, at least the ngtp_sa signal 212, the fwdly 304 signal, and the fwdly_connect signal 312 can contribute to the broader DWL tracking (i.e., can involve various signals, mechanisms, or processes for ensuring synchronization, accurate data handling, and efficient operation specifically linked to the DWL within the memory circuitry) concept that can ensure synchronization, accurate data handling, and efficient operation throughout the memory circuitry.

As one advantage, the example enhanced RC delay control circuit 300 can optimize write operations of the memory without modifying the existing logic circuitry or architecture. Instead, inventive aspects allow for the capacity to incorporate an additional RC tracking (for optimizing write operations) alongside the primary RC tracking used for both read and write operations. As may be appreciated, such additional RC tracking does not involve extra logic but can solely contribute to an extra desired delay for successful writes. Advantageously, the additional RC delay can provide enhanced tracking capabilities, effectively adapting to varying process conditions such as temperature fluctuations.

In another advantage, the example enhanced RC delay control circuit 300 can preserve power and minimize area while enhancing the write operation's efficiency by adding a supplementary tracking mechanism. Further, the additional tracking can compensate for the delay needed specifically for successful writes, improving the memory system's reliability across different environmental conditions and process variations. In another advantage, the example enhanced RC delay control circuit 300 would not compromise the efficiency of read operations. Moreover, the addition of independent logic can contribute to saving both area and power.

In another advantage, the programmable RC delay chains 302 can offer a distinct advantage in flexibility by leveraging programming code that can adjust or tune the programmable RC delay as needed based on a specific instance size. Moreover, this adaptability facilitates fine-tuning the memory system's behavior, optimizing based on varying conditions across different memory instances. For instance, the route taken by the fwdly_connect signal 312 can directly influence its delay within the system. A shorter path can imply lesser resistance and capacitance delay, potentially leading to faster signal propagation. Conversely, a longer or more complex path can introduce more delay. Further, the flexibility to adjust the additional tracking for write operations based on the instance size empowers the ability to precisely tailor the system's performance.

In another advantage, the example enhanced RC delay control circuit 300 can provide a level of customization. Such customization allows for an optimal level of extra tracking desired for the write operation based on the specifics of each memory instance, ensuring an efficient and effective operation without compromising on performance.

In another advantage, the example enhanced RC delay control circuit 300 can provide a programmable RC delay, allowing for specific adjustments in signal timing to optimize the write operation without affecting the read operation. Further, the approach utilizes the existing RC tracking for the initial phase and extends it by introducing an additional delay specifically tailored for the write operation. Moreover, the handling of signal delay and routing can ensure a 'smoother' transition for signals into the RC tracking mechanism, ultimately setting the stage for an efficient write operation. Furthermore, the technique can allow for maintaining the integrity of the write process while not compromising the read operation's efficiency; a delicate balance that is useful in memory system design.

In another advantage, the inventive capacity for additional RC delay (in the context of the latest technology nodes, especially N3E) provide meticulous control over process variations and temperature sensitivity. Unlike fixed logic delays, which might not adequately adapt to temperature fluctuations and varied resistance scenarios, the overall RC delay can play a role in ensuring signal integrity, particularly in challenging conditions. In scenarios where temperatures are high and resistance levels increase, the resulting delays significantly impact signal slopes, potentially causing issues in write operations. To counter such scenarios, a higher RC delay can elongate the signal pulse, ensuring a successful write operation even under challenging temperature and resistance conditions. In certain cases, the use of fixed-stage delays (e.g., a series of inverters) might not sufficiently address these challenges, as they provide minimal delay adjustments incapable of effectively handling varying resistance and temperature scenarios. Hence, the emphasis on an additional RC delay becomes useful, as the additional RC delay can offer the flexibility to adapt to temperature changes and resistance variations, ensuring the write operation's success by elongating signal pulses to meet operational conditions despite adverse environmental conditions.

The example enhanced RC delay control circuit 300 can optimize a write operation procedure for an STP circuit in a memory system, such as SRAM. Further, the technique can involve configuring delay elements, such as the at least one or more first delay elements 304A, 304B, 304C, 304D, 304E, . . . , 304N, within an example asynchronous self-timed path (STP) circuit 200, that correspond to read and/or write logic circuitry on a DWL. Further, the logic delay, derived from the delay elements can determine a pulse width for the circuit's functionality. Initially, a first RC delay, influenced by a given logic delay, would dictate the duration of signal propagation through the DWL and DBL. Then, to enhance the write operation, an extended DWL, such as the DWL 318 can be introduced, accompanied by a programmable second RC delay that impacts a second signal (i.e., the fwdly signal 304) on the DWL 318. Further, a subsequent write operation can utilize the augmented pulse width governed by this second RC delay.

In certain implementations, the example asynchronous self-timed path (STP) circuit 200 includes delay elements not only for write logic but also for read logic circuitry on the same DWL and DBL, each utilizing buffer-containing delay elements. Further, an overall logic delay can involve a combination of write logic, fixed delays, and read logic delays, ensuring comprehensive control over timing aspects. Adjusting the example asynchronous self-timed path (STP) circuit 200 can involve incorporating the extended DWL 318, possibly determined based on memory size, enabling a programmable turn at specific column cells in the column IOs, and/or optimizing the circuit for diverse memory instances. The example asynchronous self-timed path (STP) circuit 200 can innovatively optimize write operations in the memory system by precisely managing RC delays, incorporating additional DWLs, and implementing voltage-controlled adjustments to maintain optimal performance across varying operating conditions.

Figure 4A:
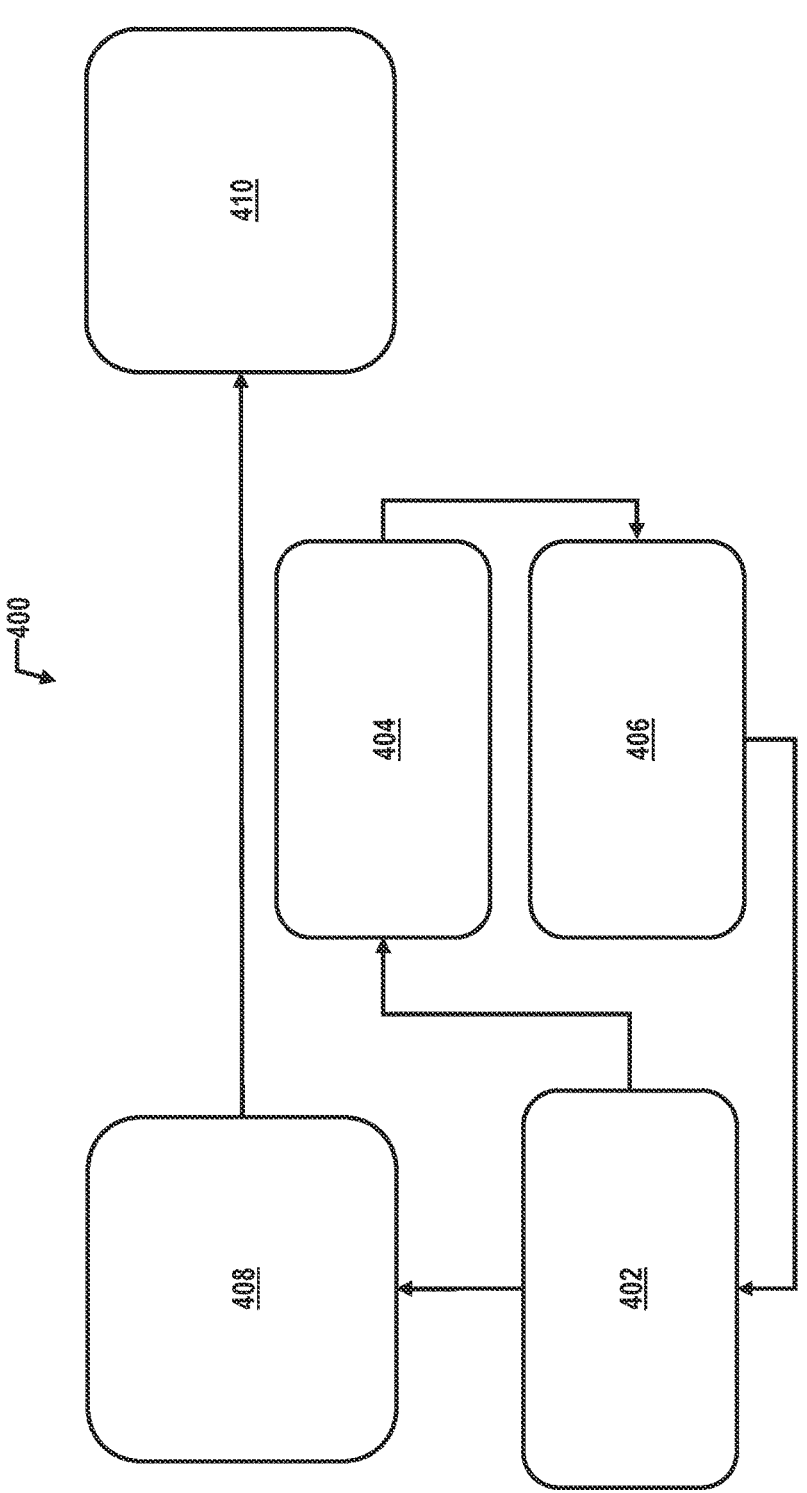
FIG. 4A is a diagram, in accordance with certain implementations.

FIG. 4A is a diagram of an example flexible read and write tracking circuit 400, in accordance with some implementations. As illustrated in FIG. 4A, the example flexible write tracking circuit 400 can include a control block 402. Further, in some implementations, the control block 402 can be the same control block as the control block 102 of FIG. 1. Additionally, the example flexible read and write tracking circuit 400 can include a read tracking block 404, a write tracking block with enhanced RC delay control block 406, a word line generator 408, and a memory array 410.

In an example operation, the control block 402 can serve as a hub in managing the intricate operations within the memory array 410. Further, the control block 402 can oversee both read and write operations through communication with the read tracking block 404 and the write tracking with enhanced RC delay control block 406 (e.g., associated with the write tracking). In operation, the control block 402 can act as a central coordinator, receiving and interpreting various signals related to memory functions. Further, the control block 402 can orchestrate the synchronization between the read tracking block 404 (e.g., configured to handle read-related processes such as retrieving and interpreting data from the memory array 410) and the write tracking with enhanced RC delay control block 406 (e.g., configured for precise and optimized write operations by managing the additional RC delay tracking). Moreover, the control block 402 can employ logic and signaling mechanisms to receive, process, and relay information between these distinct components. Furthermore, the control block 402 can interpret signals from the read tracking block 404 to ensure seamless data retrieval and can interpret signals from the write tracking with enhanced RC delay control block 406 to regulate and optimize write operations. Additionally, the control block may facilitate the synchronization of these processes to ensure efficient memory performance.

Continuing an example operation, the read tracking block 404 can function as an intermediary stage between the control block 402 and the write tracking with enhanced RC delay control block 406, coordinating read operations and contributing to the write process's optimization. In certain implementations, the read tracking block 404 can function similar to the read mode combinational logic block 214 of FIG. 2. Upon receiving signals (e.g., instructions) from the control block 402, the read tracking block 404 can decipher and processes this input. The input can include commands related to read operations, determining timing, and coordinating data retrieval from the memory array 410. Further, the read tracking block 404, can orchestrate the operations for efficient and accurate data reading from the memory array 410. Moreover, the read tracking block 404 can synchronize various signals, including address signals, timing control, and data retrieval commands. Such signals routed through the read tracking block 404 can undergo processing to ensure their alignment with the read process's conditions. The processing can involve adjusting delays, managing signal integrity, and preparing the signals for subsequent stages. Once the read-related operations are completed, the read tracking block 404 can pass on the processed signals or relevant information to the write tracking with enhanced RC delay control block 406.

Continuing an example operation, the write tracking block enhanced RC delay control block 406 can play a role in optimizing the write operations within the example flexible write tracking circuit 400. In certain implementations, the write tracking block enhanced RC delay control block 406 can align with the functions of the write mode combinational logic, programmable fixed delay block 216, and the RC tracking block 222 of FIG. 2. Signals arriving from the read tracking block 404 can undergo processing within the write tracking block enhanced RC delay control block 406. Further, the write tracking block enhanced RC delay control block 406 can augment the signals through RC delay manipulation to ensure an optimal pulse width for successful write operations. Moreover, the write tracking block enhanced RC delay control block 406 can employ programmable RC delay techniques (e.g., as described with reference to FIGS. 1-3) to fine-tune the signal characteristics, specifically augmenting the pulse width to meet the conditions for reliable write operations. These conditions can involve adjusting delay elements or introducing additional delay paths to achieve the desired signal characteristics. By incorporating additional tracking mechanisms or adjusting delay elements, the write tracking block enhanced RC delay control block 406 can ensure that signals destined for write operations can be finely tuned and optimized, guaranteeing successful writes into the memory array 410. Further, an output from the write tracking block enhanced RC delay control block 406 can be fed back to the control block 402, completing a feedback loop that allows the control block 402 to regulate and oversee the write operation's progress. Moreover, the communication with the control block 402 can ensure synchronization and coordination across the example flexible write tracking circuit 400.

Continuing with such an example operation, the word line generator block 412 can enable access to the memory array 410 based on the directives received from the control block 402. In certain implementations, the word line generator block 412 can function similar to the WLX cells 110A and 110B in FIG. 1. Further, the word line generator 408 can receive instructions (e.g., control signals) from the control block 402, indicating specific memory locations within the memory array 410 that can be accessed for read or write operations. Upon receiving these directives, the word line generator 408 can orchestrate the activation of word lines within the memory array 410. Further, the word lines can correspond to the rows of memory cells that contain the data to be read from or written into. Using the information provided by the control block 402, the word line generator 408 can decode memory addresses to identify the specific word lines associated with the requested memory cells. Further, the word line generator 408 can ensure accurate addressing and selection of the intended memory locations. Once the word lines are selected, the word line generator 408 can amplify and distribute the signals across the memory array 410. Further, the signal distribution can facilitate the precise activation of the selected word lines, enabling data retrieval or storage within the targeted memory cells. Moreover, the word line generator 408 can ensure proper timing and synchronization of signals to align with the memory array's operational conditions, preventing conflicts or data corruption during read or write operations. As the word line generation is executed, the word line generator 408 can provide feedback to the control block 402, confirming the successful activation of the designated word lines or signaling any discrepancies that require corrective actions.

In certain implementations, the example flexible write tracking circuit 400 can tune read and write operations using a self-timed (i.e., asynchronous) path circuit. For the read operation, the tuning involves a primary RC delay, constituting a significant proportion (e.g., 90%), followed by a logic delay derived from a programmable chain specific to read logic (e.g., 10%). Conversely, in the write operation's tuning, the sequence entails the primary RC delay (e.g., 60%) followed by the same logic delay as in the read operation (i.e., from a programmable chain for write logic). Subsequently, a fixed delay (e.g., 10% contributed by write logic and fixed delay circuitry) is incorporated, followed by a secondary RC delay (e.g., 30%). Alternatively said, the programmable delay chains 302 are positioned after ngtp_sa, subsequent to the primary RC delay. Regarding the specifics, the first RC delay can correspond to a delay corresponding with signal propagation with the first DWL and a DBL, while the second RC delay can be associated with a delay corresponding to signal propagation with an extended DWL. Further, the tuning operations can ensure that both read and write processes are optimized by adjusting different delay elements within the self-timed path circuit. Additionally, the balanced tuning strategy can enhance the efficiency and performance of both read and write cycles in the STP circuitry.

Figure 4B:
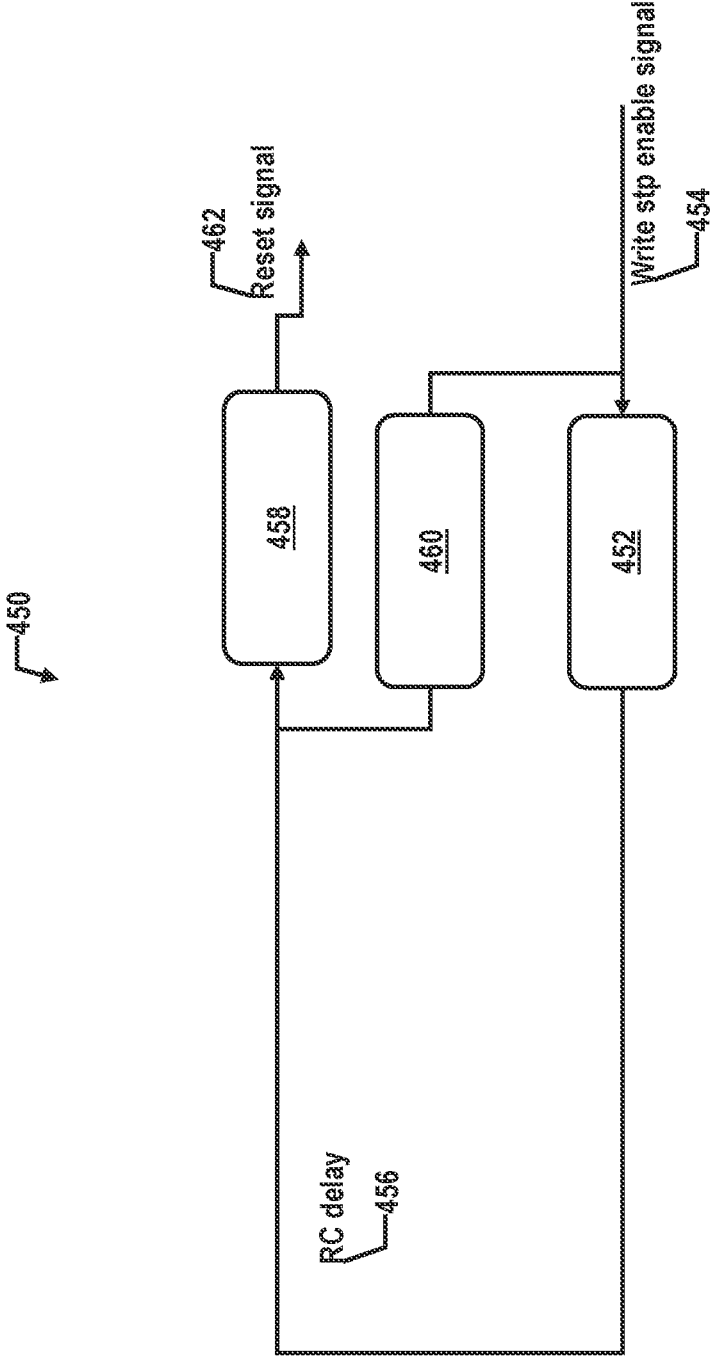
FIG. 4B is a diagram, in accordance with certain implementations.

FIG. 4B is a diagram of an example write tracking block enhanced RC delay control block 450, in accordance with some implementations. As illustrated in FIG. 4B, the example write tracking block enhanced RC delay control block 450 can includes a near-end driver 452, a sensing driver 458, and a controlled driver 460. In certain implementations, the example write tracking block enhanced RC delay control block 450 functions similar to the example write tracking block enhanced RC delay control block 406.

In an example operation, the near-end driver 452 can receive a write STP enable signal 454 from the read tracking block 404, that can trigger the near-end driver's functionality. Further, the near-end driver 452 can govern an RC delay 456 imparted to both a sensing driver 458 and a controlled driver 460. Moreover, the near-end driver's operation can involve initiating and propagating the RC delay 456 through the signal path. The RC delay 456 can establish the timing for subsequent processes within the circuit. While the exact internal mechanisms might vary, the near-end driver 452 can function as an inverter, imparting the delay to the write STP enable signal 454. Further, the delayed write STP enable signal 454 can then bifurcate into two paths. Firstly, the delayed write STP enable signal 454 can feed into the sensing driver 458 that further refines the delayed write STP enable signal 454 for subsequent operations. Secondly, delayed write STP enable signal 454 can enter the controlled driver 460. Unlike traditional setups, the controlled driver 460 can be modulated based on voltage levels, aiming to optimize the pulse width of the RC delay 456. Further, the near-end driver's efficiency in producing a precise and controlled delay significantly influences the overall performance of the circuit, particularly in ensuring proper timing and signal integrity during write operations. Moreover, the delayed write STP enable signal 454 to both the sensing driver 458 and the controlled driver 460 can set the stage for optimized signal processing and successful write operations within the system.

Continuing with an example operation, the controlled driver 460 can modulate the delayed write STP enabled signal 454, ensuring optimized performance based on varying voltage levels. Further, the controlled driver 460 can fine-tune the pulse width of the signal, thereby influencing the timing and efficiency of subsequent operations within the circuit. Moreover, the controlled driver 460 can operate based on the received delayed write STP enabled signal 454 that has already undergone an initial delay imparted by the near-end driver 452. Upon receiving this delayed signal, the controlled driver 460 can evaluate the voltage levels associated with the operation of the memory. Furthermore, the controlled driver 460 can adjust the pulse width of the signal, aiming for an optimal timing window that aligns with the specific voltage conditions. Further, the adjustment can directly impact the overall RC delay of the signal, ensuring that the write operation occurs with precision and efficiency, regardless of the voltage variation. Furthermore, the controlled driver's operation can involve modulating the strength or duration of the signal in response to voltage changes. For example, at higher voltages, the controlled driver 460 can adjust the signal to accommodate a longer pulse width to meet the timing conditions. Conversely, at lower voltages, the controlled driver 460 can optimize the signal by reducing the pulse width to ensure timely and efficient write operations. By dynamically adjusting the pulse width based on voltage levels, the controlled driver 460 can fine-tune the RC delay 456, ensuring the write operation occurs optimally, maintaining signal integrity, and enhancing overall performance within the memory system.

Continuing with an example operation, the sensing driver 458 can interpret the delayed write STP enabled signal 454 and generate a reset signal 462 sent back to the control block 402. Further, the sensing driver 458 can assess the delayed signal and produce the reset signal 462 for the memory operation. Upon receiving the delayed write STP enabled signal 454, the sensing driver 458 can evaluate the signals characteristics, such as timing and voltage levels. Further, the sensing driver 458 can analyze the signal to determine the appropriate moment for initiating the reset operation within the memory system. Moreover, the sensing driver 458 can accurately sense the trailing edge or specific conditions of the delayed signal to generate the reset signal 462. The reset signal can serve as a marker or trigger, indicating the completion of the write operation or a specific phase within the memory circuitry. Further, the timing and precision of the reset signal 462 can play a role in ensuring the proper sequence of operations and the overall reliability of the memory system. By accurately sensing the delayed write signal and generating the reset signal 462 at the right moment, the sensing driver 458 can contribute to maintaining the integrity and efficiency of the memory's write operation. Ultimately, the sensing driver 458 can detect specific attributes of the delayed write signal and translate that information into the reset signal 462, providing synchronization and control signals for the memory's correct operation, facilitating a seamless and accurate write process.

The example write tracking block with enhanced RC delay control 450, illustrated in FIG. 4B, can offer several advantages in optimizing memory write operations. In one advantage, the implementation integrates the controlled driver 460 that can adapt the RC delay 456 based on voltage variations. Further, the adaptability can ensure that the RC delay 456 is finely tuned to the operating voltage, maximizing performance efficiency.

In another advantage, the presence of the controlled driver 460 can allow for precise manipulation of pulse width, ensuring the write operation's timing aligns with the voltage level. Further, the control enhances the systems robustness, minimizing errors caused by voltage fluctuations.

In another advantage, by varying the RC delay 456 with the controlled driver 460, the system can achieve optimized write pulses. Further, the optimization can ensure that write operations occur reliably and accurately across different voltage levels, improving overall memory efficiency.

In another advantage, the ability to modulate the RC delay 456 can allow for fine-tuning the pulse width. Further, the optimization can prevent over or underestimation of the delay, thereby maximizing performance without compromising efficiency.

In another advantage, the controlled driver 460 can enable the system to function optimally across various voltage scenarios. Further, the controlled driver 460 can ensure that even at lower voltages, the write pulses are appropriately timed, avoiding signal distortion, and ensuring successful write operations.

In another advantage, through the sensing driver 458, the system can accurately generate reset signals based on the analyzed RC delayed signals. Further, the precision in reset generation can contribute to reliable synchronization and control within the memory system.

In another advantage, the fine-tuned RC delay 456, controlled by the controlled driver 460, can enhance the systems reliability by minimizing the potential for write operation errors, thereby ensuring consistent performance across different voltage levels and environmental conditions.

In another advantage, the presence of the controlled driver 460 can allow for external control or modulation, offering flexibility in adjusting the RC delay 456 based on specific conditions or varying environmental conditions.

The example write tracking block with enhanced RC delay control 450 can achieve precise and optimized write operations through improved RC tracking within a memory's STP circuit. Further, the example write tracking block with enhanced RC delay control 450 can determine the STP circuits characteristics, including delay elements linked to write logic circuitry, logic delay determination based on these elements, and configuring the initial RC delay and subsequent programmable delays to augment pulse widths for write operations. The example write tracking block with enhanced RC delay control 450, can also incorporate delay elements related to read logic circuitry, employing buffers for these elements within the STP circuit, and establishing the logic delay by combining delays associated with write logic, fixed delays, and read logic.

The example write tracking block with enhanced RC delay control 450 can adjust the STP circuit by integrating an extended DWL based on memory size, as well as employing a voltage-controlled driver to modify pulse widths concerning the memory's operating voltage. Further, the driver can be activated above a specific voltage threshold and can ensure optimal pulse widths by adjusting the RC delay, thereby enhancing overall performance. Moreover, the voltage-controlled driver can be controlled via specific voltage-controlled pins at distinct voltage levels that can facilitate adjustments for improved write operations. Furthermore, the use of the controlled driver equipped with a voltage sensor can further refine and optimize the pulse width of the RC delay, ensuring that the memory operates efficiently and reliably in voltage scenarios.

In certain implementations, the controlled driver 460 can be configured as a transistor device controlled by voltage-controlled pins at different voltage levels to modify pulse widths in a memory system. Further, the configuration can aid in optimizing the RC delay and improving overall performance during write operations.

Figure 5:
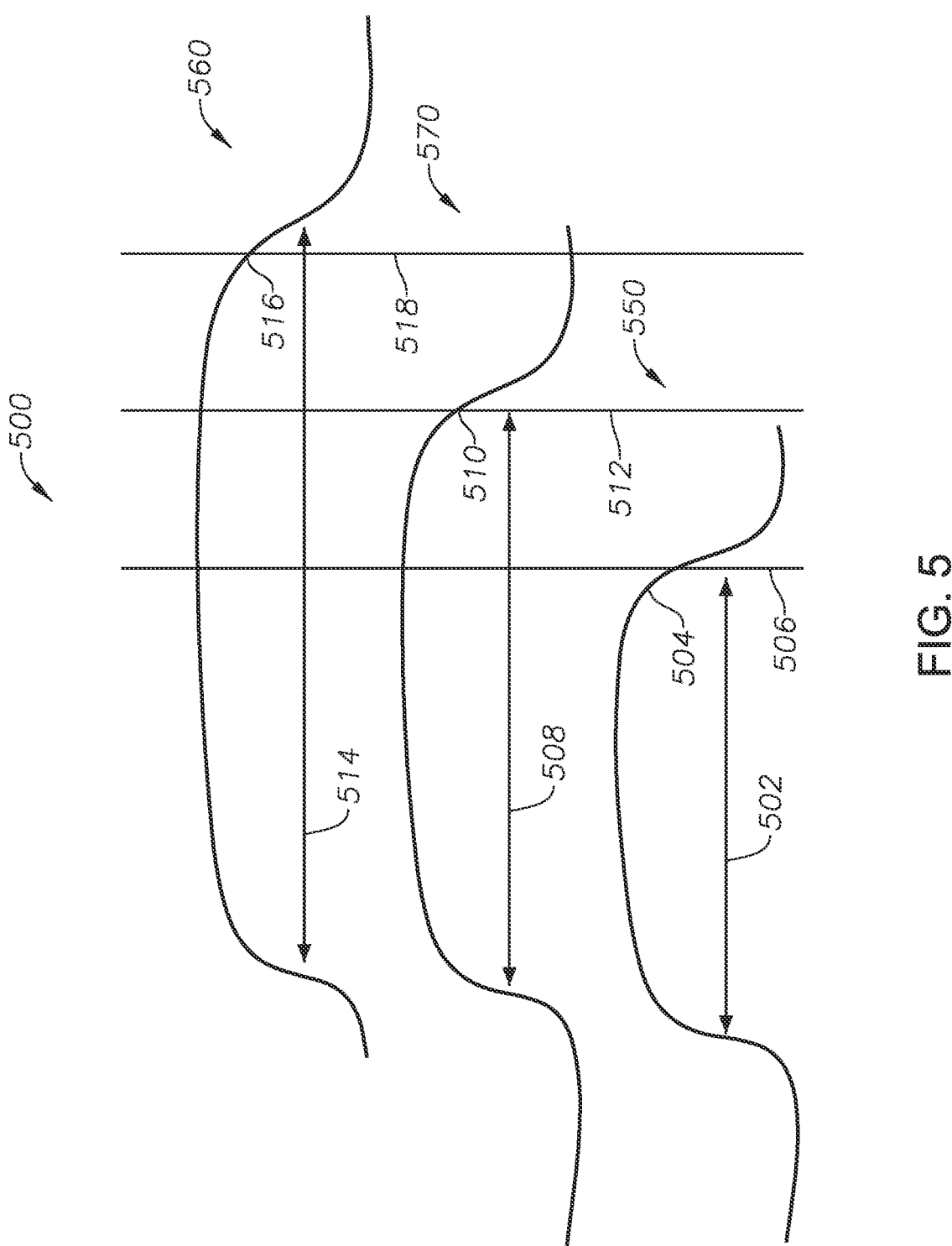
FIG. 5 is a waveform diagram, in accordance with certain implementations.

FIG. 5 is a diagram 500 depicting various waveforms 550, 560, and 570 showcasing the impact of RC delays and voltage on WL pulse width, in accordance with some implementations. As illustrated in FIG. 5, for the initial delay waveform 550, a pulse width 502 can represent a pulse width generated by a first RC delay and a logic delay. The pulse width 502 can include a falling edge 504 that can occur at a first time 506. In certain implementations, the pulse width 502 can be an insufficient pulse width for the write operation.

As illustrated in FIG. 5, for the enhanced delay waveform 560, a pulse width 514 can represent a pulse width generated by a first RC delay, a logic delay, and a second RC delay. In one instance, a falling edge 516 can occur at a third time 518, indicating a delayed pulse width resulting from fixed RC delay settings not optimized for varying voltage levels. While longer in time than the pulse width 502, the pulse width 514 can possibly lead to suboptimal performance in write operations, either causing excessive delays or inadequate pulse widths, impacting the accuracy and precision of memory write processes.

As illustrated in FIG. 5, for the voltage controlled enhanced delay waveform 570, a pulse width 508 can exhibit a falling edge 510 occurring at a second time 512, representing an optimized pulse width adapted to specific voltage levels to enhance write operation precision in memory systems. Further, the optimized delay, manipulated by a controlled driver, can ensure the pulse width aligns precisely with voltage variations, maximizing performance and accuracy.

Figure 6:
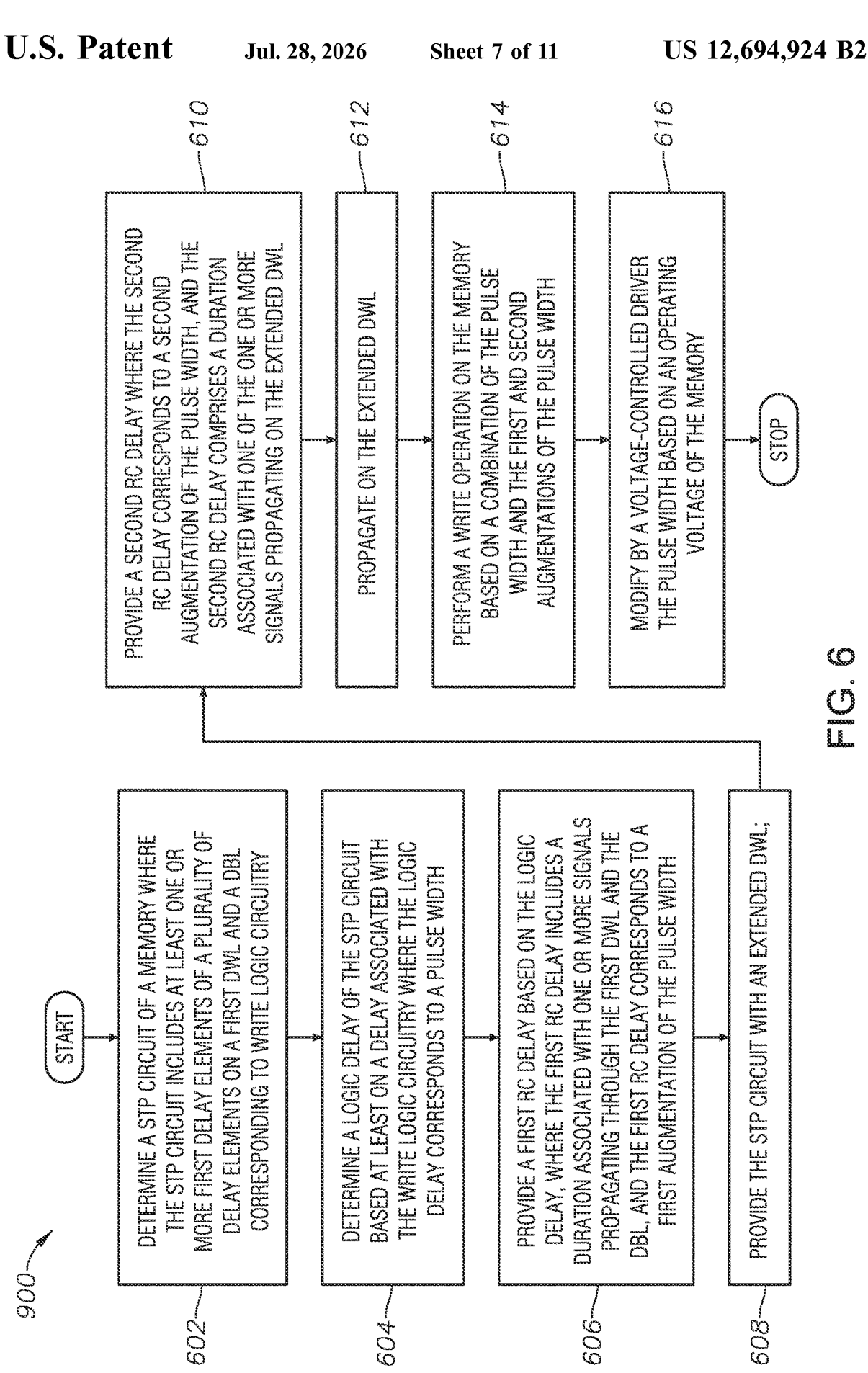
FIG. 6 is an example procedure, in accordance with certain implementations.

FIG. 6 is a diagram of an example procedure for precise and accurate write operation due to improved RC tracking 600, in accordance with some implementations. While FIG. 6 shows a sequence of steps in the example procedure 600, one of ordinary skill in the art understands that any order of sequences is possible without departing from the spirit of the implementations. The example procedure 600 may be performed with each of the implementations in FIGS. 1, 2, 3, 4A, 4B, and 5. The sequence shown for the example procedure 600 is provided as an example for the reader's understanding.

In block 602 of the example procedure 600, a self-timed path (STP) circuit of a memory (e.g., self-timed memory, e.g., SRAM) can be determined (i.e., provided), where the STP circuit includes at least one or more first delay elements of a plurality of delay elements (i.e., programmable delay chain(s)) corresponding to write logic circuitry (e.g., write-mode combination logic)) on a first dummy wordline (DWL) and a dummy bitline (DBL) of the STP circuit. As one example, with reference to various implementations as described in FIGS. 1-3, the STP circuit 200 of a memory can be provided, where the STP circuit 200 can include at least one or more delay elements 304A, 304B, 304C, 304D, 304E, . . . , 304N corresponding to write logic circuitry, such as the write mode combinational logic and programmable fixed delay block 216, on a first DWL 120 and a DBL 122.

In block 604 of the example procedure 600, a logic delay of the STP circuit can be determined (i.e., provided) based at least on a delay associated with the write logic circuitry (i.e., provided by the at least one or more first delay elements), where the logic delay corresponds to a pulse width. As one example, with reference to various implementations as described in FIGS. 2, 3 and 5, a logic delay of the STP circuit 200 can be determined (i.e., provided) based at least on a delay associated with the write logic circuitry (e.g., provided by the at least one or more first delay elements 304A, 304B, 304C, 304D, 304E, . . . , 304N), where the logic delay corresponds to a pulse width, such as pulse width 502.

In block 606 of the example procedure 600, a first (i.e., an initial) resistor-capacitor (RC) delay based on the logic delay can be provided, where the first RC delay can include a duration associated with one or more signals (i.e., tracking) signal (e.g., ngtp_sa, fwdly, and wdly combined) propagating through the first DWL and the DBL and the first RC delay corresponds to a first augmentation (e.g., an increase) of the pulse width. As one example, with reference to various implementations as described in FIGS. 3 and 5, a first (i.e., an initial) resistor-capacitor (RC) delay based on the logic delay can be provided, where the first RC delay can include a duration associated with one or more (i.e., tracking) signals (e.g., the ngtp_sa signal 212, fwdly and the wdly signal 220 combined) propagating through the first DWL 120 and the DBL 122 and the first RC delay corresponds to a first augmentation (e.g., a difference between the pulse width 502 and pulse width 508) of the pulse width.

In block 608 of the example procedure 600, an extended DWL can be provided (e.g., tuning/tracking/validating) by the STP circuit. As one example, with reference to various implementations as described in FIG. 3, the extended DWL 318 can be provided (e.g., tuning/tracking/validating) by the STP circuit.

In block 610 of the example procedure 600, a second RC delay (i.e., a programmable RC delay) can be provided where the second RC delay corresponds to a second augmentation of the pulse width, and the second RC delay comprises a duration associated with one of the one or more signals (e.g., fwdly). As one example, with reference to various implementations as described in FIGS. 3 and 5, a second RC delay (i.e., a programmable RC delay) can be provided where the second RC delay corresponds to a second augmentation (e.g., corresponding to a difference of the pulse width 514 and the pulse width 502) of the pulse width 514, and the second RC delay comprises a duration associated with one of the one or more signals (e.g., the fwdly signal 304 incorporating the fwdly_connect signal 312, and the fwdly_turn signal 314).

In block 612 of the example procedure 600, the one of the one or more signals is configured to propagate on an extended DWL. As one example, with reference to various implementations as described in FIG. 3, the second signal (e.g., fwdly 304 incorporating the fwdly_connect signal 312, and the fwdly_turn signal 314) is configured to propagate on the extended DWL 318.

In block 614 of the example procedure 600, a write operation can be performed on the memory (e.g., any self-timed memory) based on the pulse width and the first and second augmentations of the pulse width. As one example, with reference to various implementations as described in FIG. 5, a write operation can be performed on the memory (e.g., any self-timed memory) using the second augmentation (e.g., corresponding to a difference of the pulse width 514 and the pulse width 502) of the pulse width 514.

In block 616 of the example procedure 600, the (increased) pulse width can be modified (e.g., adjusted, reduced), by a voltage-controlled driver (i.e., secondary, additional driver), based on an operating voltage (level) of the memory (e.g., preventing a "too long scenario" of the pulse width 514). As one example, with reference to various implementations as described in FIGS. 4 and 5, the pulse width 514 can be modified (e.g., adjusted, reduced to the pulse width 508), by the voltage-controlled driver 460 (i.e., secondary, additional driver), based on an operating voltage (level) of the memory (e.g., preventing the "too long scenario" of the pulse width 514).

FIG. 7 is a diagram of an example procedure for optimized combined read and write RC delay tuning on a self-timed path circuit in self-timed memory 700, in accordance with some implementations. While FIG. 7 shows a sequence of steps in the example procedure 700, one of ordinary skill in the art understands that any order of sequences is possible without departing from the spirit of the implementations. The example procedure 700 may be performed with each of the implementations in FIGS. 1, 2, 3, 4A, 4B, and 5. The sequence shown for the example procedure 700 is provided as an example for the reader's understanding.

In block 702 of the example procedure 700, a self-timed (i.e., asynchronous) path (STP) circuit can be determined (e.g., via tuning/tracking/validating) based on a first resistor-capacitor (RC) delay and a logic delay (of the STP circuit), wherein the first RC delay includes a delay associated with (one or more signals propagating through) a first dummy wordline (DWL) and a dummy bitline (DBL). As one example, with reference to various implementations as described in FIG. 1, a self-timed (i.e., asynchronous) path (STP) circuit 100 can be determined (e.g., tuning/tracking/validating) based on a first resistor-capacitor (RC) delay and a logic delay (of the STP circuit), wherein the first RC delay includes a delay associated with (e.g., one or more signals propagating through) a first dummy wordline (DWL) 120 and a dummy bitline (DBL) 122.

In block 704 of the example procedure 700, the STP circuit can be adjusted (e.g., via tuning for tracking/validating) based on a second RC delay, where the second RC delay includes a delay associated with (a signal (e.g., fwdly)) propagating through an extended DWL (e.g., 'additional' circuit path for signals fwd_connect and fwdly_turn adjustable by the column cell of the column IOs, where fwd_connect and fwdly_turn provide a "programmable turn"). As one example, with reference to various implementations as described in FIGS. 2 and 3, the STP circuit 200 can be extended or adjusted (e.g., via tuning for tracking/validating) based on a second RC delay, where the second RC delay includes a delay associated with (i.e., a signal (the fwdly signal 304)) propagating through) the extended DWL 318 (e.g., 'additional' circuit path for the fwd_connect signal 312 and the fwdly_turn signal 314 adjustable by the particular column cell of the column IOs, where the fwd_connect signal 314 and the fwdly_turn signal 314 provide a "programmable turn").

In block 706 of the example procedure 700, a pulse width of the STP circuit can be modified (e.g., adjusted, reduced), by a voltage-controlled driver (i.e., secondary, additional driver), based on an operating voltage (level) of the memory (e.g., preventing a "too long scenario" a pulse width of the RC delay). As one example, with reference to various implementations as described in FIGS. 2, 4, and 5, a pulse width of the STP circuit 200 can be modified (e.g., adjusted, reduced), by the voltage-controlled driver 460 (i.e., secondary, additional driver), (e.g., corresponding to the reduction of the pulse width 514 to the pulse width 508) based on an operating voltage (level) of the memory (e.g., preventing a "too long scenario" of the pulse width 514).

Figure 8:
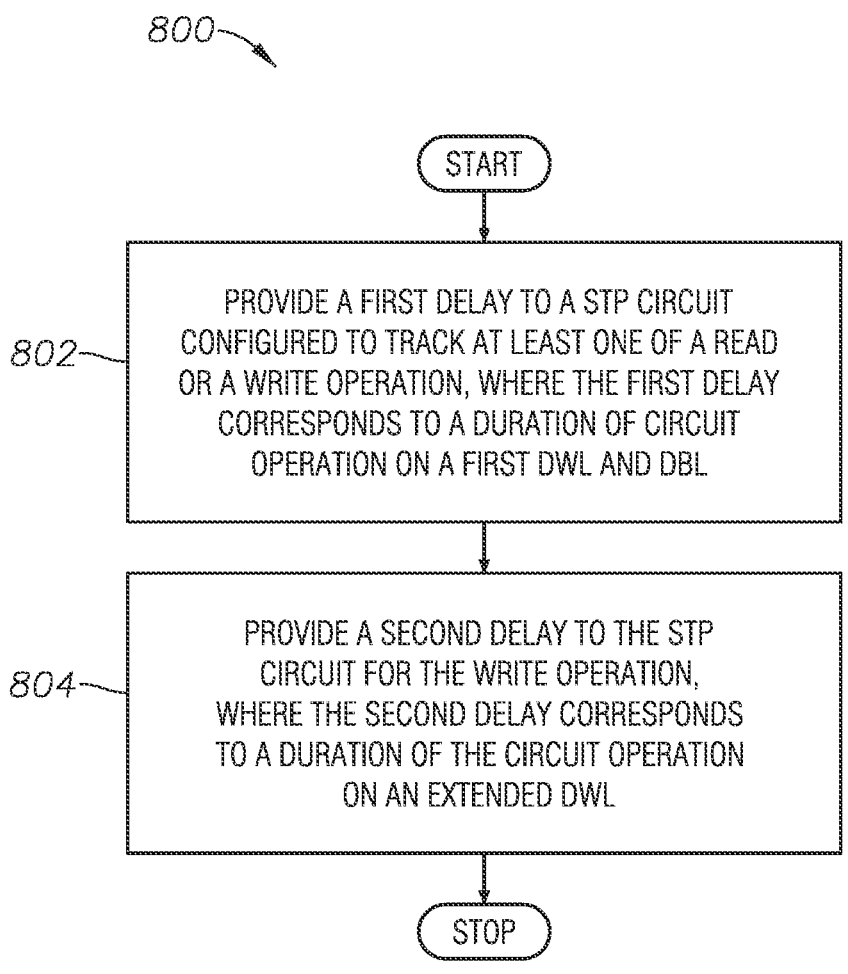
FIG. 8 is an example procedure, in accordance with certain implementations.

FIG. 8 is a diagram of an example procedure for optimized combined read and write RC delay tuning on a self-timed path circuit in self-timed memory 800, in accordance with some implementations. While FIG. 8 shows a sequence of steps in the example procedure 800, one of ordinary skill in the art understands that any order of sequences is possible without departing from the spirit of the implementations. The example procedure 800 may be performed with each of the implementations in FIGS. 1, 2, 3, 4A, 4B, and 5. The sequence shown for the example procedure 800 is provided as an example for the reader's understanding.

In block 802 of the example procedure 800, a first delay (corresponding to a $1^{st}$ RC tracking) can be provided to a self-timed path (STP) circuit configured to track at least one of a read or a write operation, where the first delay corresponds to a duration of circuit operation on a first dummy wordline (DWL) and dummy bitline (DBL). As one example, with reference to various implementations as described in FIG. 1, a first delay (corresponding to a $1^{st}$ RC tracking) can be provided to the self-timed path (STP) circuit 100 configured to track at least one of a read or a write operation, where the first delay corresponds to a duration of circuit operation on the first dummy wordline (DWL) 120 and the dummy bitline (DBL) 122.

In block 804 of the example procedure 800, a second delay (i.e., $2^{nd}$ RC tracking) can be provided to the (same) STP circuit for the (same) write operation, wherein the second delay corresponds to a duration of the circuit operation on an extended DWL. As one example, with reference to various implementations as described in FIG. 1, a second delay (corresponding to a $2^{nd}$ RC tracking) can be provided to the (same) STP circuit 100 for the (same) write operation, wherein the second delay corresponds to a duration of the circuit operation on an extended DWL 124.

Figure 9:
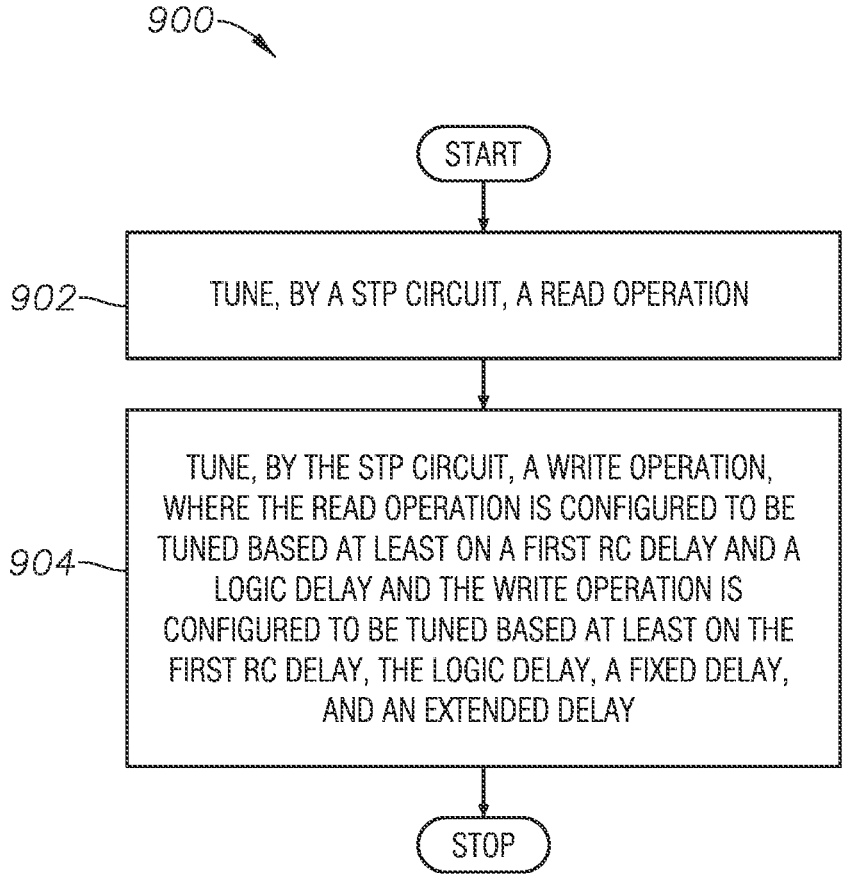
FIG. 9 is an example procedure, in accordance with certain implementations.

FIG. 9 is a diagram of an example procedure for tuning a STP circuit for read and write operations 900, in accordance with some implementations. While FIG. 9 shows a sequence of steps in the example procedure 900, one of ordinary skill in the art understands that any order of sequences is possible without departing from the spirit of the implementations. The example procedure 900 may be performed with each of the implementations in FIGS. 1, 2, 3, 4A, 4B, and 5. The sequence shown for the example procedure 900 is provided as an example for the reader's understanding.

In block 902 of the example procedure 900, a read operation (i.e., a read cycle) can be tuned by a self-timed (i.e., asynchronous) path circuit, where the read operation is configured to be tuned based at least on a first resistor-capacitor (RC) delay and a logic delay. As one example, with reference to various implementations as described in FIG. 1, a read operation (i.e., a read cycle) can be tuned by a self-timed (i.e., asynchronous) path circuit 100, where the read operation is configured to be tuned based at least on a first resistor-capacitor (RC) delay (e.g., 90%) and a logic delay (e.g., the programmable delay chains 302 for the read logic 10%).

In block 904 of the example procedure 900, a write operation (i.e., a write cycle) can be tuned by the (same) self-time path circuit, the write operation is configured to be tuned based at least on the first RC delay (e.g., 60%), the (same) logic delay (programmable delay chain for write logic), a fixed delay (e.g., 10% by write logic and fixed delay circuitry), and a second RC delay (e.g., 30%). As one example, with reference to various implementations as described in FIGS. 1 and 3, a write operation (i.e., a write cycle) can be tuned by the (same) self-time path circuit 100, the write operation is configured to be tuned based at least on the first RC delay (e.g., 60%), the (same) logic delay (the programmable delay chains 302 for write logic), a fixed delay (e.g., 10% by write logic and fixed delay circuitry), and a second RC delay (e.g., 30%).

Figure 10:
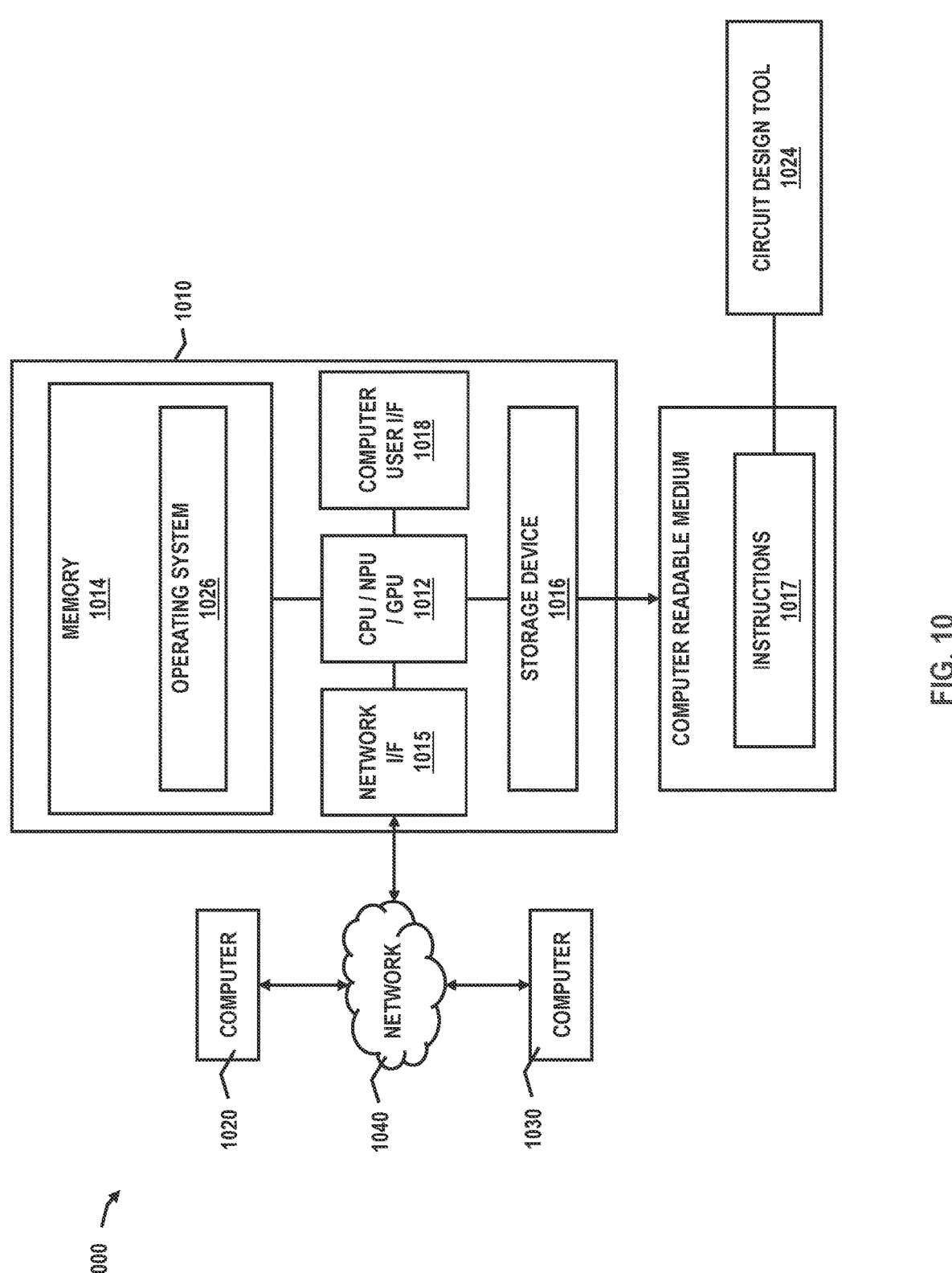
FIG. 10 is a diagram, in accordance with certain implementations.

FIG. 10 depicts the hardware components within computer system 1000 and the hardware components utilization in achieving precise and accurate write operations. These components can play a role in implementing improved RC tracking, enabling methods for optimized read and write RC delay tuning in a STP system, and tuning STP circuits for both read and write operations. In certain implementations, the example computer system 1000 (e.g., networked computer system and/or server) may include circuit design tool 1024 and execute software based on the procedure as described with reference to procedure 600, 700, 800, and 900 in FIGS. 6, 7, 8, and 9. In certain implementations, the circuit design tool 1024 may be included as a feature of an existing compiler software program.

The circuit design tool 1024 may provide generated computer-aided physical layout designs for self-timed path (STP) circuits. The procedures 600, 700, 800, and 900 may be stored as program code as instructions 1017 in the computer readable medium of the storage device 1016 (or alternatively, in memory 1014) that may be executed by the computer 1010, or networked computers 1020, 1030, other networked electronic devices (not shown) or a combination thereof. In certain implementations, each of the computers 1010, 1020, 1030 may be any type of computer, computer system, or other programmable electronic device. Further, each of the computers 1010, 1020, 1030 may be implemented using one or more networked computers, e.g., in a cluster or other distributed computing system.

In certain implementations, the system 1000 may be used with semiconductor integrated circuit (IC) designs that contain all standard cells, all blocks or a mixture of standard cells and blocks. In a particular example implementation, the system 1000 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 1000 may be stored in one or more of memory 1014 or storage devices 1016 of computer 1010 or in networked computers 1020, 1030.

The system 1000 may perform the following functions automatically, with variable user input: determination of read current conditions/thresholds, determination of leakage current conditions/thresholds, identification of logic designs (i.e., periphery circuit designs (i.e., logic threshold voltages, threshold voltage implant layers)), determination of a desired threshold voltage-combination, determination of minimum voltage assist conditions, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 1000 to produce the target results that are required by a designer. In certain implementations, the system 1000 may also provide for the capability to manually perform functions such as: cell region creation, block placement, pad, and cell placement (before and after automatic placement), net routing before and after automatic routing and layout editing. Moreover, verification functions included in the system 1000 may be used to determine the integrity of a design after, for example, manual editing, design rule checking (DRC) and layout versus schematic comparison (LVS).

In one implementation, the computer 1010 includes a central processing unit (CPU) 1012 having at least one hardware-based processor coupled to a memory 1014. The memory 1014 may represent random access memory (RAM) devices of main storage of the computer 1010, supplemental levels of memory (e.g., cache memories, non-volatile or backup memories (e.g., programmable or flash memories)), read-only memories, or combinations thereof. In addition to the memory 1014, the computer system 1000 may include other memory located elsewhere in the computer 1010, such as cache memory in the CPU 1012, as well as any storage capacity used as a virtual memory (e.g., as stored on a storage device 1016 or on another computer coupled to the computer 1010).

The computer 1010 may further be configured to communicate information externally. To interface with a user or operator (e.g., a circuit design engineer), the computer 1010 may include a user interface (I/F) 1018 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1010 may include a network interface (I/F) 1015 which may be coupled to one or more networks 1040 (e.g., a wireless network) to enable communication of information with other computers and electronic devices. The computer 1010 may include analog and/or digital interfaces between the CPU 1012 and each of the components 1014, 1015, 1016, and 1018. Further, other non-limiting hardware environments may be used within the context of example implementations.

The computer 1010 may operate under the control of an operating system 1026 and may execute or otherwise rely upon various computer software applications, components, programs, objects, modules, data structures, etc. (such as the programs associated with the procedure 600 and related software). The operating system 1026 may be stored in the memory 1014. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 1026 in the example of FIG. 10 is shown in the memory 1014, but components of the software may also, or in addition, be stored at non-volatile memory (e.g., on storage device 1016 (data storage) and/or the non-volatile memory (not shown). Moreover, various applications, components, programs, objects, modules, and the like may also execute on one or more processors in another computer coupled to the computer 1010 via the network 1040 (e.g., in a distributed or client-server computing environment) where the processing to implement the functions of a computer program may be allocated to multiple computers 1020, 1030 over the network 1040.

In example implementations, circuit diagrams have been provided in FIGS. 1-5 whose redundant description has not been duplicated in the related description of analogous circuit diagrams. It is expressly incorporated that the same cell layout diagrams with identical symbols and/or reference numerals are included in each of embodiments based on its corresponding figure(s).

Although one or more of FIGS. 1-9 may illustrate systems, apparatuses, or methods according to the teachings of the disclosure, the disclosure is not limited to these illustrated systems, apparatuses, or methods. One or more functions or components of any of FIGS. 1-9 as illustrated or described herein may be combined with one or more other portions of another of FIGS. 1-9. Accordingly, no single implementation described herein should be construed as limiting and implementations of the disclosure may be suitably combined without departing from the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 1014, the storage device 1016, or both, may include tangible, non-transitory computer-readable media, or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus, or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

The subject matter of the claims is not limited to the implementations and illustrations provided herein, the intention is that modified forms of those implementations including portions of implementations and combinations of elements of different implementations be in accordance with the claims. In the development of any such implementation, there is an appreciation as in any engineering or design project, that numerous implementation-specific decisions can be made to achieve the developers' specific goals, such as compliance with system-related and business-related constraints, that vary from one implementation to another. Moreover, while such a development effort is complex and time consuming, there is an appreciation for those of ordinary skill having benefit of these implementations the development would nevertheless be a routine undertaking of design, fabrication, and manufacture.

Reference has been made in detail to various implementations, examples of that can be illustrated in the accompanying drawings and figures. In the above description, numerous specific details can be set forth to provide a thorough understanding of the implementations provided herein. However, the implementations provided herein can be practiced without these specific details. In some other instances, well-known methods, procedures, components, circuits, and networks have not been described in detail so as not to unnecessarily obscure details of the implementations.

Although the terms first, second, and the like can be used herein to describe various elements, these elements should not be limited by these terms. These terms can be used to distinguish one element from another. For example, a first element can be termed a second element, and, similarly, a second element is able to be termed a first element. The first element and the second element can be both elements, respectively, but they are not to be considered the same element.

The terminology used in the description of the implementations provided herein is for the purpose of describing implementations and is not intended to limit the implementations provided herein. As used in the description of the implementations provided herein and appended claims, the singular forms a, an, and they can be intended to include the plural forms as well, unless the context clearly indicates otherwise. The term and/or as used herein refers to and encompasses all possible combinations of one or more of the associated listed items. The terms includes, including, comprises, and/or comprising, when used in this specification, specify a presence of stated features, integers, steps, operations, elements, and/or components, but do not preclude the presence or addition of one or more other features, integers, steps, operations, elements, components and/or groups thereof.

As used herein, the term if may be construed to mean when or upon or in response to determining or in response to detecting, depending on the context. Similarly, the phrase if it is determined or if [a stated condition or event] is detected may be construed to mean upon determining or in response to determining or upon detecting [the stated condition or event] or in response to detecting [the stated condition or event], depending on the context. The terms up and down; upper and lower; upwardly and downwardly; below and above; and other similar terms indicating relative positions above or below a given point or element can be used in connection with some implementations of various technologies described herein.

While the foregoing is directed to implementations of various techniques described herein, other, and further implementations can be devised in accordance with the implementations herein, that may be determined by the claims that follow.

Although the subject matter has been described in language specific to structural features and/or methodological acts, the subject matter defined in the appended claims is not necessarily limited to the specific features or acts described above. Rather, the specific features and acts described above can be disclosed as example forms of implementing the claims.

What is claimed is:

1. A method comprising:
determining a self-timed path (STP) circuit of a memory, wherein the STP circuit comprises at least one or more first delay elements of a plurality of delay elements on a first dummy wordline (DWL) and a dummy bitline (DBL) corresponding to write logic circuitry of the STP circuit;
determining a logic delay of the STP circuit based at least on a delay associated with the write logic circuitry, wherein the logic delay corresponds to a pulse width;
providing a first resistor-capacitor (RC) delay based on the logic delay, wherein:
the first RC delay comprises a duration associated with one or more signals propagating through the first DWL and the DBL, and
the first RC delay corresponds to a first augmentation of the pulse width;
providing the STP circuit with an extended DWL;
providing a second RC delay, wherein:
the second RC delay comprises a duration associated with one of the one or more signals propagating through the extended DWL; and
the second RC delay corresponds to a second augmentation of the pulse width, and
performing a write operation on the memory based on a combination of the pulse width and the first and second augmentations of the pulse width.

2. The method of claim 1, wherein the STP circuit comprises:
at least one or more second delay elements of the plurality of delay elements corresponding to read logic circuitry of the STP circuit, and wherein:
each of the one or more first and second delay elements comprise a buffer.

3. The method of claim 1, wherein the logic delay is based on a combination of:
the delay associated with the write logic circuitry;
a delay associated with one or more fixed delays; and
a delay associated with the read logic circuitry.

4. The method of claim 1, wherein:
the STP circuit is extended by incorporating the extended DWL in the STP circuit;
the extended DWL is determined based on a size of a memory instance of the memory.

5. The method of claim 1, further comprising:
modifying, by a voltage-controlled driver, the pulse width based on an operating voltage of the memory.

6. The method of claim 5, wherein:
the voltage-controlled driver is activated when the operating voltage is above an operating voltage threshold, and
the voltage-controlled driver is configured to reduce the pulse width.

7. The method of claim 5, wherein the voltage-controlled driver comprises:
a transistor device configured to modify a pulse width of the RC delay.

8. The method of claim 7, wherein:
the transistor device is configured to be controlled through one or more voltage-controlled pins; and
the one or more voltage-controlled pins correspond to:
first pins enabled at a first voltage, and
second pins enabled at a second voltage.

9. The method of claim 5, wherein the controlled driver comprises a voltage sensor.

10. A method comprising:
determining a self-timed path (STP) circuit based on a first resistor-capacitor (RC) delay and a logic delay, wherein the first RC delay comprises a delay associated with a first dummy wordline (DWL) and a dummy bitline (DBL); and
extending the STP circuit based on a second RC delay, wherein the second RC delay comprises a delay associated with an extended DWL.

11. The method of claim 10, wherein:
the first RC delay and the logic delay correspond to a signal propagating though the first DWL and the DBL; and
the logic delay comprises one or more delay elements; and
each of the one or more delay elements comprise a buffer.

12. The method of claim 10, wherein the logic delay is based on a combination of:
a delay associated with write logic circuitry on the DWL and DBL of the STP circuit;
a delay associated with read logic circuitry on the DWL and DBL of the STP circuit; and
a delay associated with one or more fixed delays on the DWL and DBL of the STP circuit.

13. The method of claim 10, wherein the STP circuit is extended by incorporating the extended DWL in the STP circuit.

14. The method of claim 10, further comprising:
modifying, by a voltage-controlled driver, a pulse width of the STP circuit based on an operating voltage of the memory.

15. The method of claim 14, wherein when the operating voltage is above an operating voltage threshold, the voltage-controlled driver is activated to reduce the pulse width.

16. The method of claim 14, wherein the voltage-controlled driver comprises:
a transistor device configured to modify a pulse width of at least one of the first and the second RC delay.

17. The method of claim 16, wherein:
the transistor device is configured to be controlled through one or more voltage-controlled pins; and
the one or more voltage-controlled pins correspond to:
first pins enabled at a first voltage, and
second pins enabled at a second voltage.

18. The method of claim 14, wherein the voltage-controlled driver comprises a voltage sensor.

19. A method comprising:

providing a first delay to a self-timed path (STP) circuit configured to track at least one of a read or a write operation, wherein the first delay corresponds to a duration of a circuit operation on a first dummy wordline (DWL) and dummy bitline (DBL); and providing a second delay to the STP circuit for the write operation, wherein the second delay corresponds to a duration of the circuit operation on an extended DWL.

20. A method of claim 19, further comprising: tuning, by the STP, the read operation; and tuning, by the STP, the write operation, wherein:

the read operation is configured to be tuned based at least on a first resistor-capacitor (RC) delay and a logic delay; and the write operation is configured to be tuned based at least on the first RC delay, the logic delay, a fixed delay, and a second RC delay.

\*   \*   \*   \*   \*